United States Patent [19]

Johnson et al.

[11] Patent Number: 4,597,162
[45] Date of Patent: * Jul. 1, 1986

[54] METHOD FOR MAKING, PARALLEL PREPROGRAMMING OR FIELD PROGRAMMING OF ELECTRONIC MATRIX ARRAYS

[75] Inventors: Robert R. Johnson, Franklin; Stanford R. Ovshinsky, Bloomfield Hills, both of Mich.

[73] Assignee: Energy Conversion Devices, Inc., Troy, Mich.

[*] Notice: The portion of the term of this patent subsequent to Oct. 8, 2002 has been disclaimed.

[21] Appl. No.: 785,367

[22] Filed: Oct. 7, 1985

Related U.S. Application Data

[63] Continuation of Ser. No. 513,997, Jul. 14, 1983, Pat. No. 4,545,111, which is a continuation-in-part of Ser. No. 458,919, Jan. 18, 1983.

[51] Int. Cl.$^4$ .................................................. H01L 21/46
[52] U.S. Cl. ...................... 29/574; 29/576 B; 29/578; 29/580; 29/585; 29/591; 148/1.5; 365/113; 365/163; 357/2
[58] Field of Search ............ 29/574, 576 B, 578, 29/580, 585, 591; 148/1.5; 365/113, 163; 357/2

[56] References Cited

U.S. PATENT DOCUMENTS 4,545,111 10/1985 Johnson .................................. 29/574

Primary Examiner—Aaron Weisstuch
Attorney, Agent, or Firm—Lawrence G. Norris; Robert S. Nolan; Richard O. Gray, Jr.

[57] ABSTRACT

A method of making a parallel programmed electronic matrix array including the steps of forming at least one layer of a phase changeable material on a conductive substrate, wherein the phase changeable material has a substantially nonconductive state and a comparatively high conductive state. The layer is formed in one of the states. The method also includes irradiating selected areas of the layer to simultaneously convert the selected areas of the layer to the other one of the states to form selected substantially nonconductive layer portions and selected comparatively high conductive layer portions. Thereafter, in a preprogrammed embodiment, first and second sets of electrically conductive address lines are formed on respective opposite sides of the layer. The address lines of the first and second sets are formed for crossing at an angle to form a plurality of crossover points with the selected substantially nonconductive layer portions and the selected comparatively high conductive layer portions therebetween. In a field programmable array, the areas are irradiated through one set of lines.

28 Claims, 45 Drawing Figures

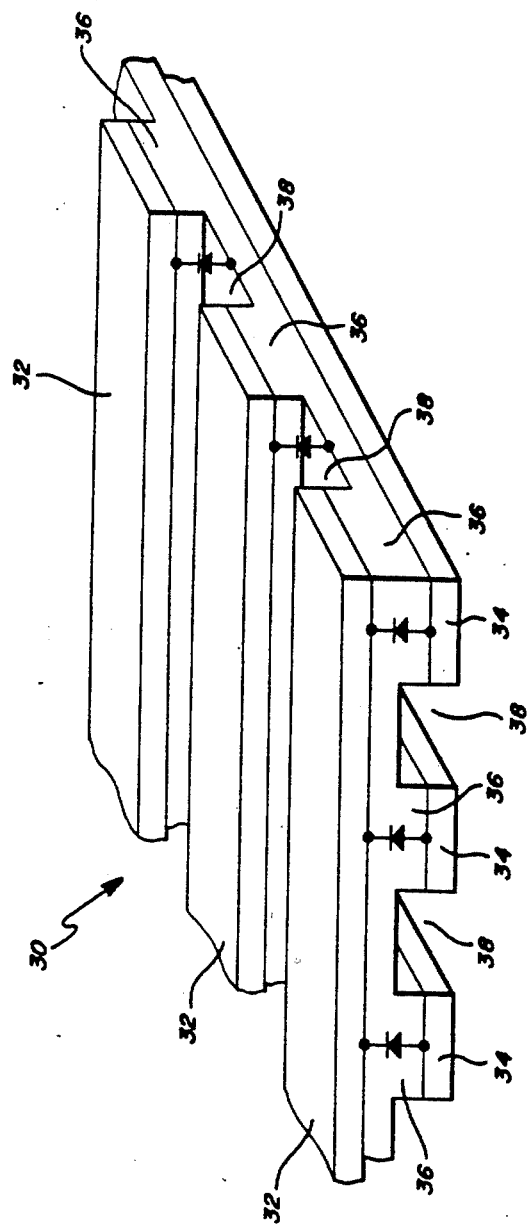

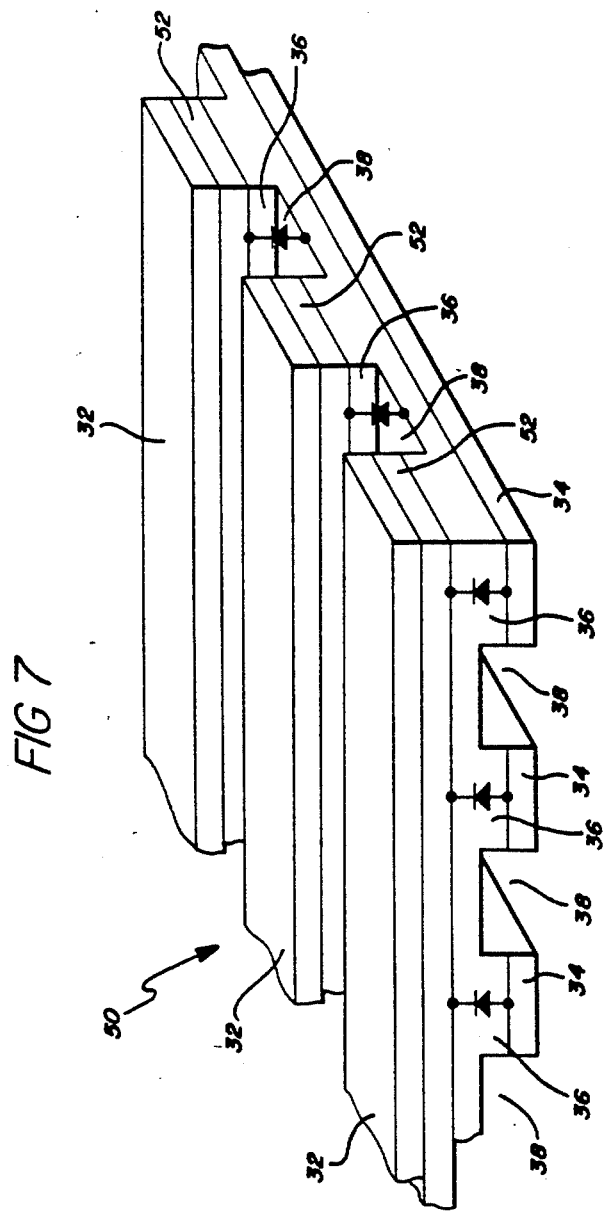

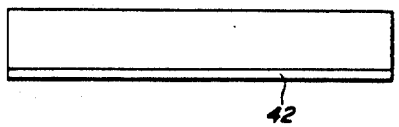
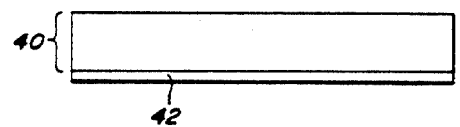
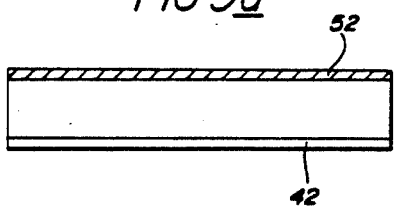
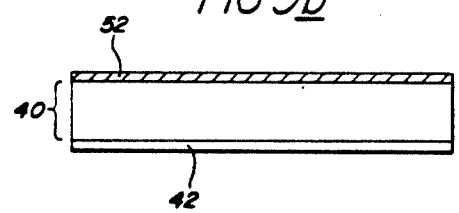
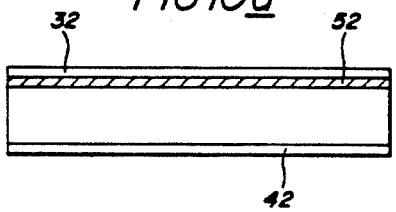
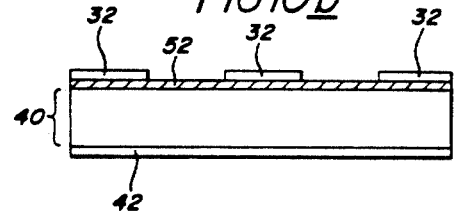
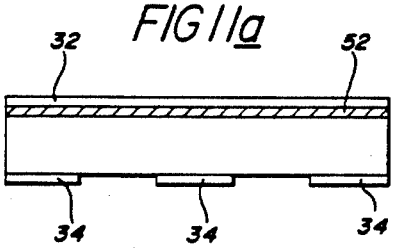
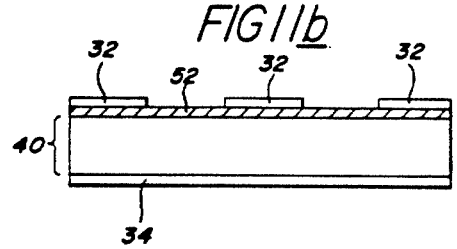
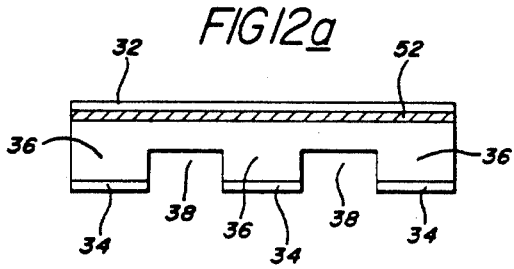
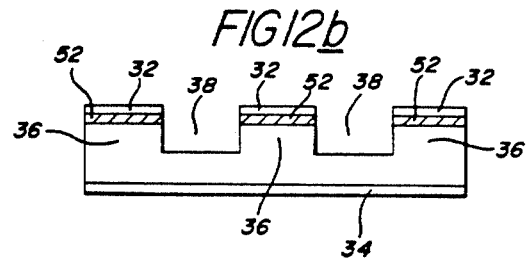

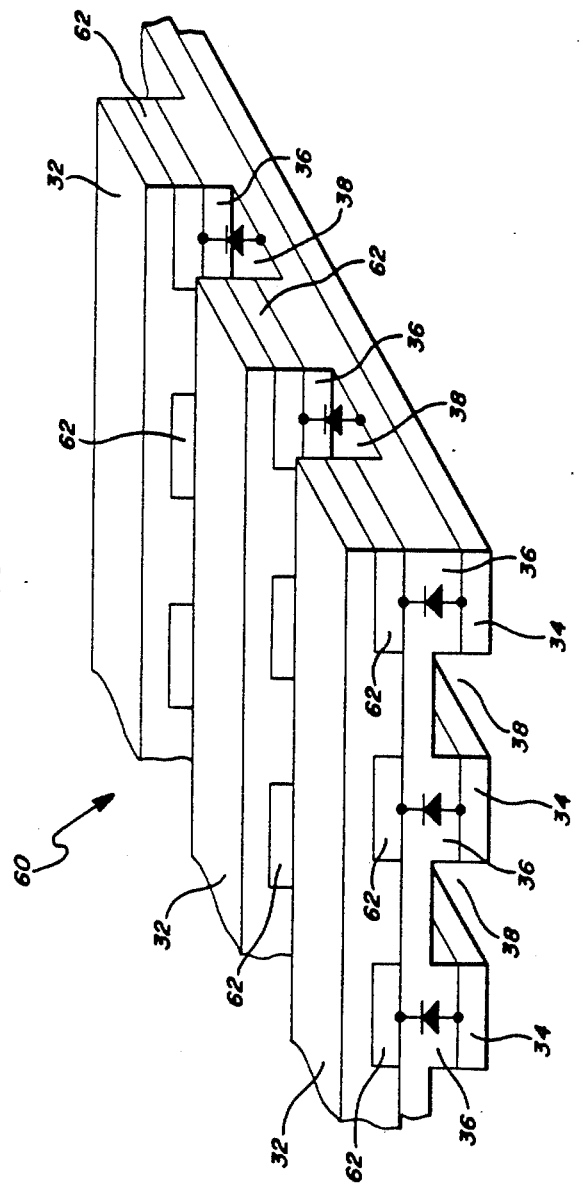

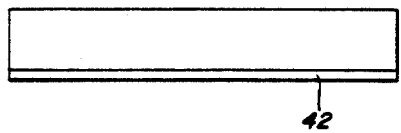
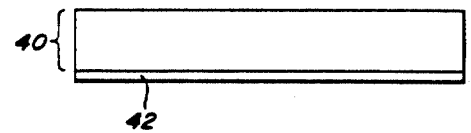
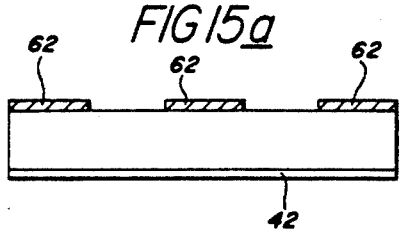
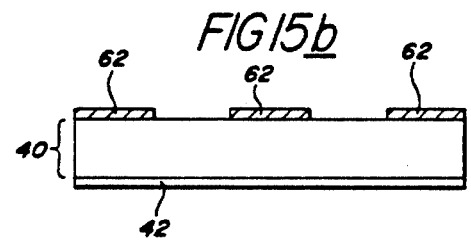
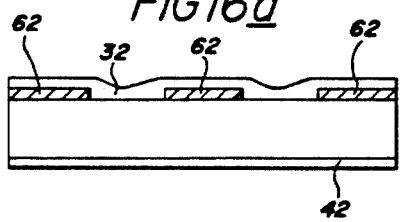
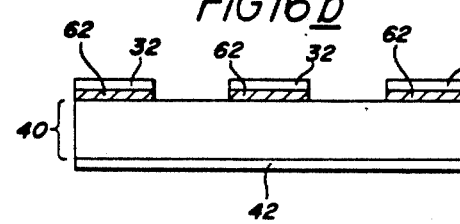
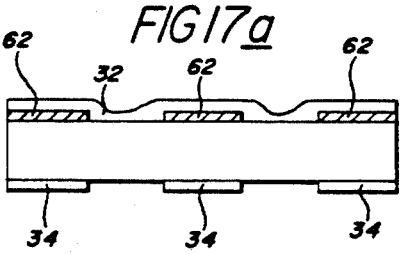
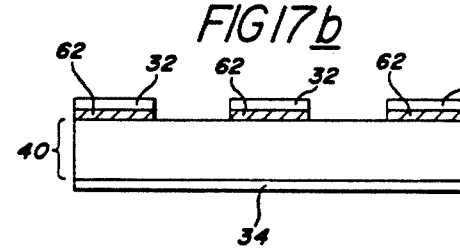
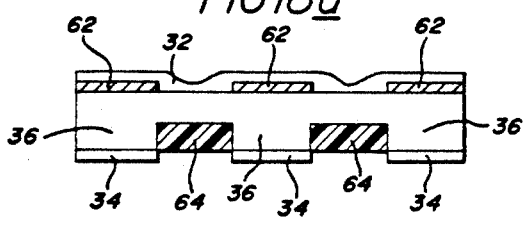
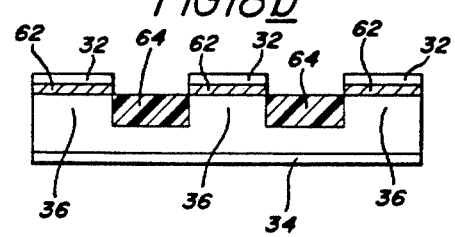

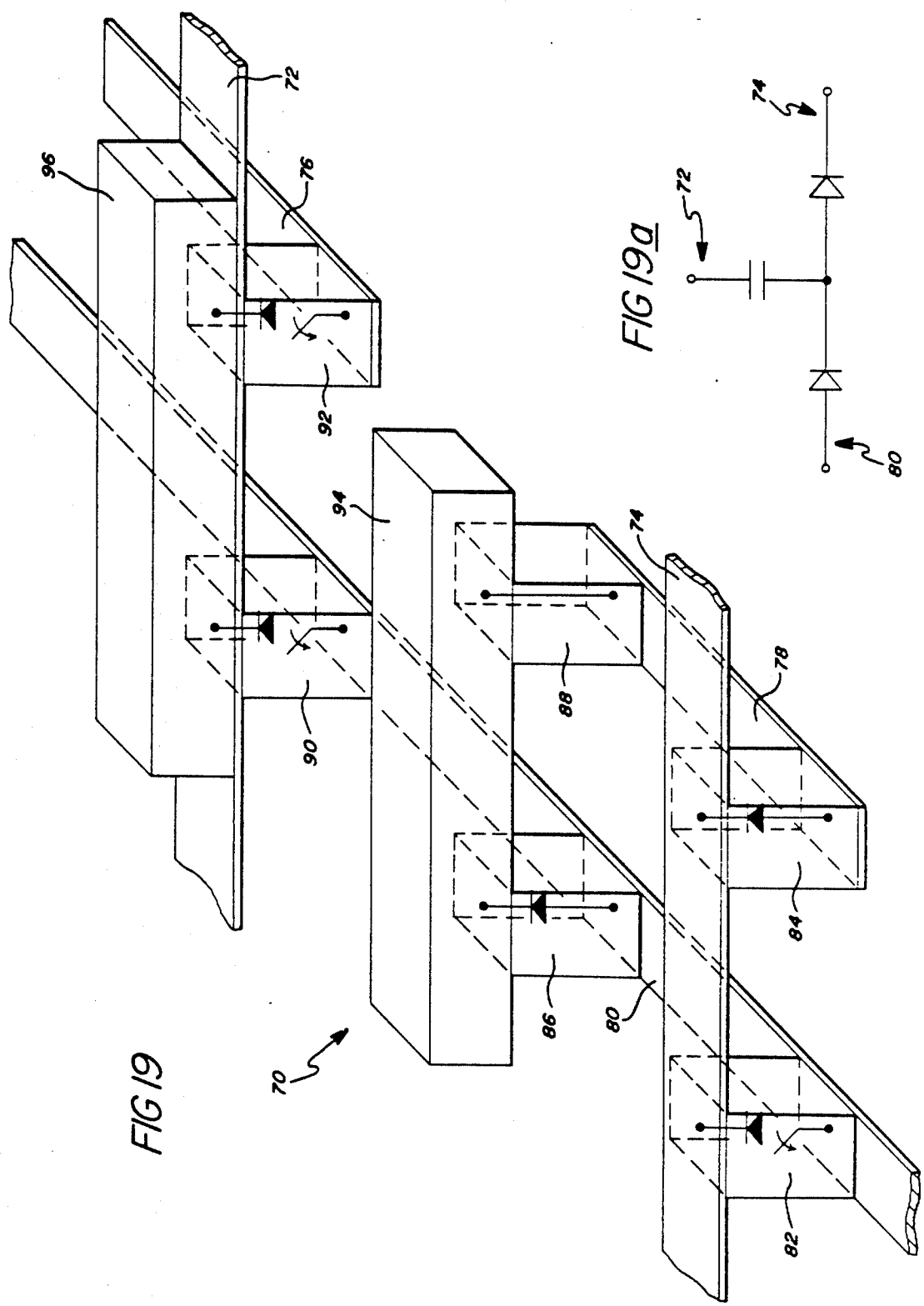

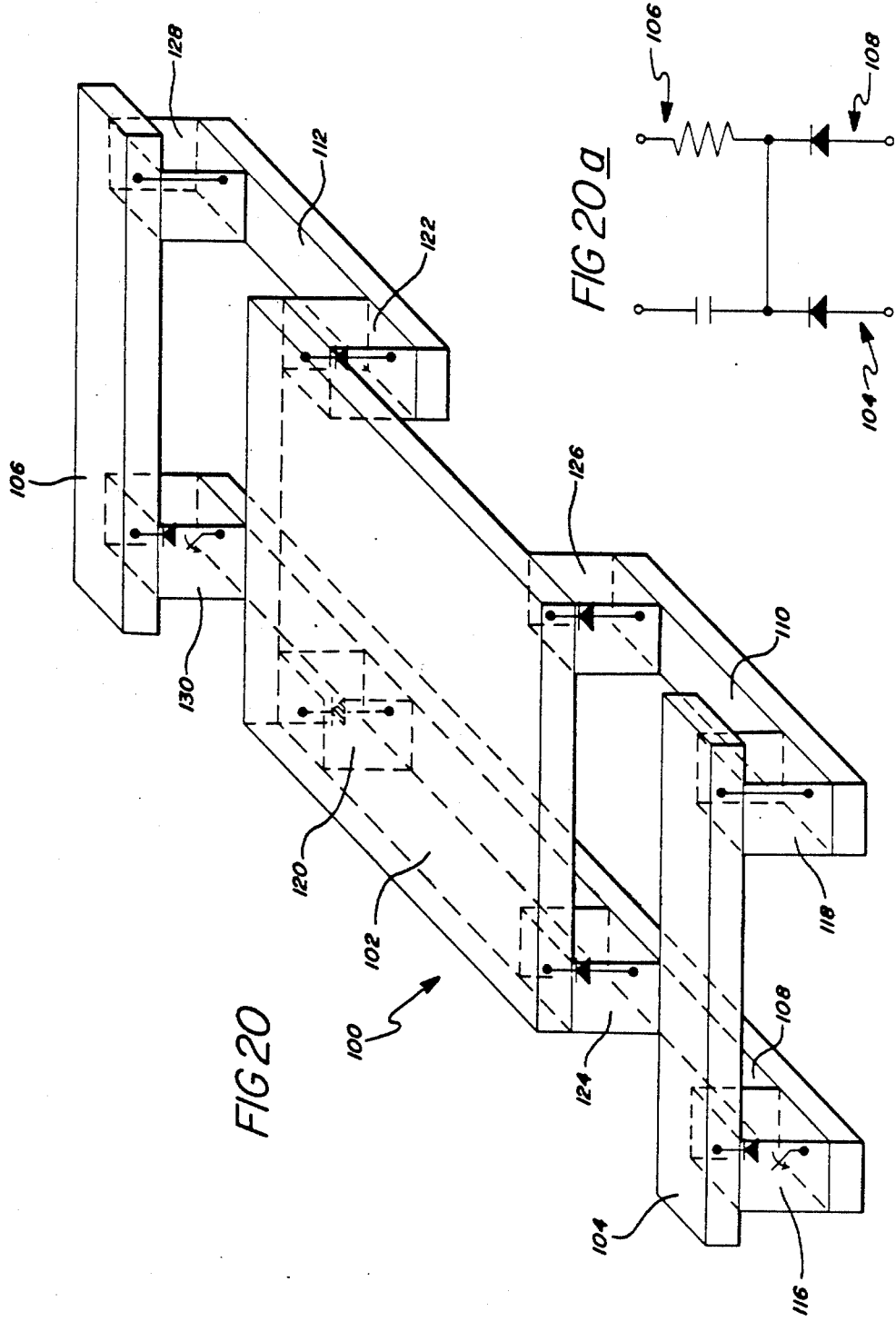

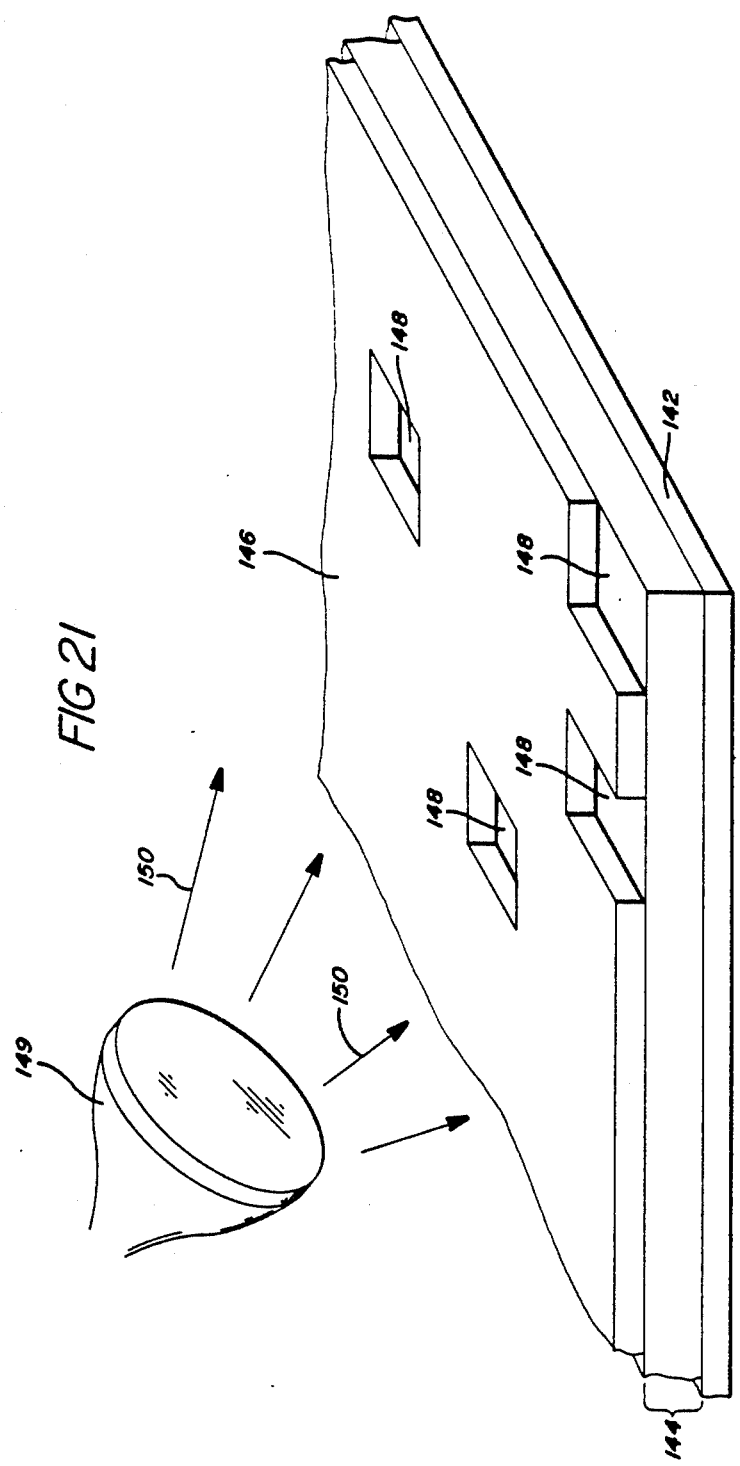

METHOD FOR MAKING, PARALLEL PREPROGRAMMING OR FIELD PROGRAMMING OF ELECTRONIC MATRIX ARRAYS

RELATED APPLICATION

This is a continuation of copending U.S. patent application Ser. No. 513,997 filed July 14, 1983, now U.S. Pat. No. 4,545,111, which is a continuation-in-part of copending U.S. patent application Ser. No. 458,919 filed Jan. 18, 1983.

BACKGROUND OF THE INVENTION

1. Field of the Invention

The present invention primarily relates to an electronic matrix array and a method of making, parallel preprogramming or field programming the same. The present invention further relates to improved preprogrammed read only memory (ROM) devices, electronically erasable programmable read only memory (EEPROM) devices, programmable read only memory (PROM) devices, and field programmable logic arrays, and flat panel displays wherein a distributed diode matrix array facilitates isolation and addressing. The present invention allows such structures to be readily preprogrammed or field programmed, where desired, in an efficient manner and made with substantially greater packing densities than prior art arrays and with reduced processing steps and lithography control tolerances. Of great importance is the fact that these structures can be parallel programmed and made in accordance with the present invention on substrates much larger than previously possible to provide substantially increased data storage, logic operations or flat panel display areas. The diode matrix of the present invention is formed from amorphous alloys including silicon deposited onto large area substrates. To that end, reference can be made to the disclosure in U.S. Pat. No. 4,217,374 to Stanford R. Ovshinsky and Masatsugu Izu entitled: Amorphous Semiconductors Equivalent to Crystalline Semiconductors and U.S. Pat. No. 4,226,898 to Stanford R. Ovshinsky and Arun Madan, of the same title, for alloys and methods of making the same which can be utilized in the invention described herein.

2. Description of the Prior Art

Silicon is the basis of the huge crystalline semiconductor industry and is the material which is utilized in substantially all the commercial integrated circuits now produced. When crystalline semiconductor technology reached a commercial state, it became the foundation of the present huge semiconductor device manufacturing industry. This was due to the ability of the scientist to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either p or n conduction type.

The semiconductor fabrication processes for making p-n junction crystals involve extremely complex, time consuming, and expensive procedures as well as high processing temperatures. Thus, these crystalline materials used in rectifying and other current control devices are produced under very carefully controlled conditions by growing individual single silicon or germanium crystals, and where p-n junctions are required, by doping such single crystals with extremely small and critical amounts of dopants. These crystal growing processes produce relatively small crystal wafers upon which the integrated circuits are formed.

In conventional crystalline integrated circuit technology the small area crystal wafer limits the overall size of the integrated circuits which can be formed thereon. In applications requiring large scale areas, such as in the display technology, the crystal wafers cannot be manufactured with as large areas as required or desired. The devices are formed, at least in part, by diffusing p or n-type dopants into the substrate. Further, each device is formed between isolation channels which are diffused into the substrate and interconnected on each level of metalization by horizontally spaced conductors. Packing density (the number of devices per unit area of wafer surface) is thereby limited on the surface of the silicon wafers because conductors cannot be placed below the diffused junction areas. Costs are increased and yields decreased by the many lithographic steps required.

Further, the packing density is extremely important because the cell size is exponentially related to the cost of each device.

In summary, crystal silicon rectifier and integrated circuit structures have to be spread horizontally across their crystalline wafer, they require many sequential processing and aligning steps, large amounts of material, high processing temperatures, are producible only on relatively small area wafers and are expensive and time consuming to produce. Devices based upon amorphous silicon alloys can eliminate these crystal silicon disadvantages. Amorphous silicon alloys are easier to manufacture than crystalline silicon and can be manufactured at lower temperatures and in larger areas.

Accordingly, a considerable effort has been made to develop processes for readily depositing amorphous semiconductor alloys or films each of which can encompass relatively large areas, if desired, limited only by the size of the deposition equipment, and which could be doped to form p-type and n-type materials to form p-n junction rectifiers and devices superior in cost and/or operation to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films resulted in such films not being successfully doped or otherwise modified to shift the Fermi level close to the conduction or valence bands making them unsuitable for making p-n junction rectifiers and other current control device applications.

In an attempt to minimize the aforementioned problems involved with amorphous silicon and germanium, W. E. Spear and P. G. Le Comber of Carnegie Laboratory of Physics, University of Dundee, in Dundee, Scotland did some work on "Substitutional Doping of Amorphous Silicon", as reported in a paper published in *Solid State Communications,* Vol. 17, pp. 1193–1196 (1975), toward the end of reducing the localized states in the energy gap in amorphous silicon or germanium to make the same approximate more closely intrinsic crystalline silicon or germanium and of substitutionally doping the amorphous materials with suitable classic dopants, as in doping crystalline materials, to make them extrinsic and of p or n conduction types.

The reduction of the localized states was accomplished by glow discharge deposition of amorphous silicon films wherein a gas of silane (SiH$_4$) was passed through a reaction tube where the gas was decomposed by a r.f. glow discharge and deposited on a substrate at a substrate temperature of about 500°–600° K. (227°–327° C.). The material so deposited on the substrate was an intrinsic amorphous material consisting of silicon and hydrogen. To produce a doped amorphous material phosphine (PH$_3$) gas for n-type conduction or diborane (B$_2$H$_6$) gas for p-type conduction was premixed with the silane gas and passed through the glow discharge reaction tube under the same operating conditions. The gaseous concentration of the dopants used was between about $5 \times 10^{-6}$ and $10^{-2}$ parts per volume. The material so deposited included supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition to substantially reduce the density of the localized states in the energy gap toward the end of making the electronic properties of the amorphous material approximate more nearly those of the corresponding crystalline material.

Greatly improved amorphous silicon alloys having significantly reduced concentrations of localized states in the energy gaps thereof and high quality electronic properties have been prepared by glow discharge as fully described in the above referenced U.S. Pat. No. 4,226,898, Amorphous Semiconductors Equivalent to Crystalline Semiconductors, which issued in the names of Stanford R. Ovshinsky and Arun Madan Oct. 7, 1980, and by vapor deposition as fully described in U.S. Pat. No. 4,217,374, which issued in the names of Stanford R. Ovshinsky and Masatsugu Izu, on Aug. 12, 1980, under the same title. As disclosed in these patents, fluorine is introduced into the amorphous silicon semiconductor alloy to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine also combines in a preferable manner with silicon and hydrogen, utilizing the hydrogen in a more desirable manner, since hydrogen has several bonding options. Without fluorine, hydrogen may not bond in a desirable manner in the material, causing extra defect states in the band gap as well as in the material itself. Therefore, fluorine is considered to be a more efficient compensating or altering element than hydrogen when employed alone or with hydrogen because of its high reactivity, specificity in chemical bonding, and high electronegativity.

As an example, compensation may be achieved with fluorine alone or in combination with hydrogen with the addition of this element(s) in very small quantities (e.g., fractions of one atomic percent). However, the amounts of fluorine and hydrogen most desirably used are much greater than such small percentages so as to form a silicon-hydrogen-fluorine alloy. Such alloying amounts of fluorine and hydrogen may, for example, be in the range of 1 to 5 percent or greater. It is believed that the alloy so formed has a lower density of defect states in the energy gap than that achieved by the mere neutralization of dangling bonds and similar defect states.

Heretofore various semiconductor materials, both crystalline and amorphous, have been proposed for utilization in rectifying type devices such as a diode. As will be described in greater detail hereinafter, the distributed diode array of the present invention is formed from amorphous alloys including silicon as for example disclosed in the applications identified above. The distributed diode array of the present invention can be utilized in the ROM, EEPROM and PROM devices of the present invention as well as in the field programmable arrays and flat panel displays of the present invention.

Heretofore various memory systems have been proposed which are divided into several types. One type is the serial type where the information in the memory system is obtained serially and where the read time for reading a particular bit of information in the memory is dependent upon where it is located in the memory. This results in long read times for obtaining the information from memory. Such types of memory systems include memory devices including a magnetic tape or a magnetic disc including the so-called floppy disc and magnetic "bubble memory" devices. While the storage information in "bubble" type memory devices potentially reduces the size and cost of memory systems and provides high information packing densities, i.e., small center-to-center distance between adjacent memory regions where the bits of information are stored, such "bubble" systems are limited to serial reading of information and do not provide for fast read, random access to the stored information.

Also, heretofore, short term data storage has been provided by random access memory (RAM) devices including transistors or capacitors at the intersections of X and Y axis conductors. Such a memory device can be set in one of two operational states. These memory devices provide a fairly high packing density, i.e., a small center-to-center distance between memory locations. A major disadvantage is that such devices are volatile since they must be continually supplied with a voltage if they are to retain their stored data. Such short term data storage devices are often referred to as volatile fast read and write memory systems.

A fast read non-volatile memory system is the read only memory (ROM) which uses transistors and rectifiers formed in semiconductor substrates with permanently open contact points or permanently closed contact points in an x-y array for storage of bits of information. Such a ROM system is typically mass-programmed during the manufacture thereof and has a fast read time and a relatively high packing density as well as being non-volatile. However, the obvious disadvantage of such a ROM system is that the data stored cannot be altered and has to be built in at the factory. Accordingly, ROM devices are made-to-order for applications involving storing of the basic operating program of a data processor or other non-altered information.

Another memory system used is a programmable read only memory (PROM) system which can be programmed once by the user and remains in that state. Once it is programmed a PROM system will operate identically to a ROM system of the same configuration.

The most commonly used PROM system incorporates fuse links positioned at each intersection of an X-Y matrix of conductors. The storage of information (logic one or logic zero) is obtained by blowing the fuse links in a given predetermined pattern. Such fuse links extend laterally on a single crystal substrate instead of vertically between crossover conductors and, as a result, such fuse links necessarily require a large area. The area of a typical memory cell or region utilizing a fuse link is about 1 to 1.6 mil$^2$.

The current needed to blow the fuse link for programming is quite high because of the necessity of completely blowing out the fuse link and because of the inherently high conductivity of the material of the fuse link. Typical currents are 50 milliamps and the power required is approximately 250 to 400 milliwatts. Also, the fuse link which is a narrow portion of a conductor deposited on a substrate, must have a precise dimension to ensure the complete and programmable blow out thereof. In this respect, photolithography and etching techniques required to fabricate such a fuse link require that such a fuse link be made with very critical tolerances.

Another major problem with fuse link type PROM devices is that the small gap in the blown fuse can become closed with accumulation of conductive material remaining adjacent to the gap by diffusion or otherwise.

The fuse link technology also has been utilized in field programmable logic arrays, redundant memory arrays, gate arrays and die interconnect arrays. Field programmable logic arrays are utilized to provide options for the integrated circuit user between the standard high volume, low cost logic arrays and the very expensive handcrafted custom designed integrated circuits. These arrays allow a user to program the low cost array for the user's specific application at a substantially reduced cost from the cost of a custom application circuit.

Heretofore it has also been proposed to provide an EEPROM (electrically erasable programmable read only memory) device, a vertically disposed memory region or cell in a memory circuit which is vertically coupled at and between an upper Y axis conductor and a lower X axis conductor in a memory matrix. Such an EEPROM system provides a relatively high packing density. Examples of such EEPROM's are disclosed in the following patents:

| U.S. Pat. No. | PATENTEE |
|---|---|
| 3,571,809 | Nelson |
| 3,573,757 | Adams |
| 3,629,863 | Neale |
| 3,699,543 | Neale |
| 3,846,767 | Cohen |
| 3,886,577 | Buckley |
| 3,875,566 | Helbers |
| 3,877,049 | Buckley |
| 3,922,648 | Buckely |
| 3,980,505 | Buckley |
| 4,177,475 | Holmberg |

Specific reference is made to the U.S. Pat. No. 3,699,543 to Neale directed to: Combination Film Deposited Switch Unit and Integrated Circuit and to U.S. Pat. No. 4,177,475 to Holmberg directed to: High Temperature Amorphous Memory Device for an Electrically Alterable Read Only Memory.

These references illustrate EEPROM devices including a matrix of X and Y axis conductors where a memory circuit, including a memory region and an isolating device is located at each crossover point and extends generally perpendicular to the crossover conductors thereby to provide a relatively high packing density.

The memory regions utilized in such EEPROM devices have typically been formed of a tellurium-based chalcogenide material and more specifically an amorphous material such as amorphous germanium and tellurium. Other materials which have rather highly reversible memory regions include $Ge_aTe_b$ wherein a is between 5 and 70 atomic percent and b is between 30 and 95 atomic percent. Some of these materials also include other elements in various percentages from 0 to 40 in atomic percent such as antimony, bismuth, arsenic, sulfur and/or selenium.

Heretofore it has also been known to provide isolating devices which are coupled in series with a memory region or cell at the intersections of orthogonal conductors, such isolating devices typically having been formed by diffusing various dopant materials into a single crystal silicon substrate to form a rectifier, transistor, or MOS device, e.g., a field effect transistor. Such a diffusion process requires horizontally spaced x-y conductors and results in lateral diffusion of the doped material into the substrate material. As a result the cell packing densities of such prior memory systems have been limited by the number of horizontal metal lines and by the degree of lateral diffusion of the dopant materials and by the margin of error required for mask alignment.

Heretofore an all thin film EEPROM device has been proposed and is disclosed in U.S. Pat. No. 3,629,863, referred to above. The all thin film memory circuit disclosed in U.S. Pat. No. 3,629,863 utilizes deposited film bidirectional threshold type isolating devices.

The devices herein utilize for each isolating device a thin film diode which is a unidirectional isolating device and which provides isolation by a high impedance p-i-n configuration in one direction to current flow thereby to provide very high OFF resistance.

It has been proposed to form a p-n junction by vacuum depositing either an n or p-type amorphous semiconductor film on an oppositely doped silicon chip substrate. In this respect, reference is made to U.S. Pat. No. 4,062,034 which discloses such a thin film transistor having a p-n junction. However, it has not been previously proposed to use a thin film deposited amorphous semiconductor film for forming p-i-n isolating devices in a programmable matrix array as described herein.

The present invention also allows the matrix arrays to be preprogrammed during the manufacture thereof in an efficient manner. While it has been known to parallel input data onto an optical memory disk by flashing selected areas thereof with light to alter the optical properties of the selected areas, it has never before been proposed to parallel preprogram or field program an electronic matrix array by concurrently irradiating selected areas of the array during or after the manufacture thereof to alter the electrical properties of selected memory devices within the arrays. This significant advance in the art, as will become clear hereinafter, allows memory arrays and logic arrays to be programmed in a parallel manner as opposed to the serial manner of programming such structures as practiced in the prior art. This allows the preprogrammed arrays of the invention to be more cost efficiently made. Together with the unique large area and memory cell structure disclosed herein, this method permits preprogrammed matrix arrays to be produced which can be utilized in numerous significant applications where high memory density and capacity are essential.

Also, bulk erasure has been performed in some types of optical disk and EEPROM device applications.

SUMMARY OF THE INVENTION

The invention provides a method of making a parallel programmed electronic matrix array comprising the steps of forming at least one layer of phase changeable material on a conductive substrate, wherein the phase changeable material has a substantially nonconductive state and a comparatively high conductive state. The layer is formed in one of the states. The method also includes irradiating selected areas of the layer to simultaneously convert the selected areas of the layer to the other one of the states to form selected substantially nonconductive layer portions and selected comparatively high conductive layer portions. Thereafter, first and second sets of electrically conductive address lines are formed on respective opposite sides of the layer. The address lines of the first and second sets are formed for crossing at an angle to form a plurality of crossover points with the selected substantially nonconductive layer portions and the selected comparatively high conductive layer portions therebetween.

The invention further provides a method of making a parallel preprogrammed memory matrix array comprising the steps of forming a continuous selection means structure and forming a layer of phase changeable material over the selection means structure. The phase changeable material has a substantially nonconductive state and a comparatively high conductive state. The layer of phase changeable material is formed in one of the states. The method further includes converting selected areas of the layer of phase changeable material simultaneously to the other state to form selected substantially nonconductive layer portions and selected comparatively high conductive layer portions. A first set of electrically conductive address lines is then formed over the exposed side of the selection means structure. Thereafter, a second set of electrically conductive address lines is formed over the phase changeable layer which set of lines crosses the first set of address lines at an angle to form a plurality of crossover points with the selected substantially nonconductive layer portions and the selected comparatively high conductive layer portions within the crossover points.

In accordance with one embodiment, the selected areas of the phase changed layer are irradiated through a mask which is brought into contact therewith. One set of address lines is preferably formed by removing portions of the conductive substrate. The other set of address lines can be formed by detecting the locations of the layer portions of one of the states and thereafter aligning the address lines on the phase changed layer according to the detected locations of the phase changed layer portions of the one of the states.

The arrays can also be formed in a field programmable embodiment. In that case, at least one set of address lines is formed of a material which is substantially transparent to the programming light wavelength. The phase change material is not switched or programmed prior to depositing the address lines and is later field programmed through the transparent address lines.

The layer of phase changeable material is preferably formed of amorphous material. For example, it can be either an amorphous silicon alloy material or a chalcogenide.

The diode structure is preferably formed by depositing a first doped semiconductor layer over the substrate, depositing an intrinisic semiconductor layer over the first layer, and depositing a second opposite conductivity doped semiconductor layer over the intrinsic layer. The semicontuctor layers are preferably formed of amorphous silicon alloys. The diode structure thus formed is one embodiment of the continuous selection means structure The method can also further include the step of removing either the comparatively high conductive or nonconductive layer portions prior to forming the address lines.

The programmed matrix array can be tested by reading the state of the material at each crossover point, optically in the case of the preprogrammed array and optically or electrically in the case of the field programmable array. Programmed crossover points which were to have been switched but are not switched can be individually switched by electronic or optical pulses or alternately the whole array can be bulk erased by light and then reprogrammed.

BRIEF DESCRIPTION OF THE DRAWINGS

FIG. 1 is a partial perspective view of an electronic diode matrix array;

FIGS. 2A through 5A are partial side views illustrating various stages of fabrication of the diode matrix array of FIG. 1;

FIGS. 2B through 5B are partial side views of the diode matrix array of FIG. 1 at the various stages of the fabrication thereof as viewed from a frame of reference perpendicular to the corresponding views of FIGS. 2A through 5A respectively;

FIG. 7 is a partial perspective view of another electronic matrix array;

FIGS. 8A through 12A are partial side views illustrating various states of fabrication of the electronic array of FIG. 7;

FIGS. 8B through 12B are partial side views of the electronic matrix array of FIG. 7 at the various states of the fabrication thereof as viewed from a frame of reference perpendicular to the corresponding views of FIGS. 8A through 12A respectively;

FIG. 13 is a partial perspective view of another electronic matrix array;

FIGS. 14A through 18A are partial side views illustrating various stages of fabrication of the electronic array of FIG. 13;

FIGS. 14B through 18B are partial side views of the electronic matrix array of FIG. 13 at the various stages of the fabrication thereof as viewed from a frame of reference perpendicular to the corresponding views of FIGS. 14A. through 18A respectively;

FIG. 19 is a partial perspective view of a flat panel display;

FIG. 19A is a schematic diagram of the equivalent circuit of the flat panel display of FIG. 19;

FIG. 20 is a partial perspective view of another flat panel display;

FIG. 20A is a schematic diagram of the equivalent circuit of the flat panel display of FIG. 20.

FIGS. 21 and 22 are partial perspective views illustrating the method of making a preprogrammed array of circuits in accordance with one embodiment of the present invention;

DESCRIPTION OF THE PREFERRED EMBODIMENTS

Figures 2A, 2B:
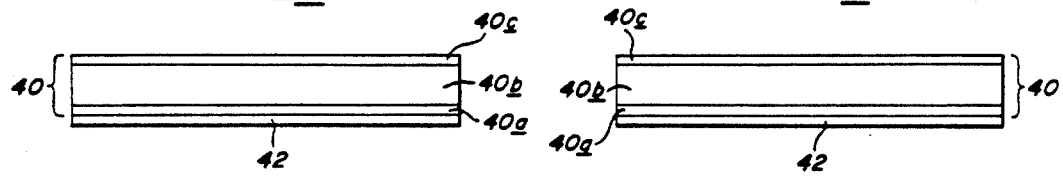

FIGS. 1-20A and their descriptions refer to the electronic matrix arrays and method of making same in parent application Ser. No. 458,919, which is incorporated herein by reference. The structure and methods described therein form an integral part of the array technology which is utilized in the parallel programming of the present invention, which is best described with regard to FIGS. 21-28.

Referring now to FIG. 1, there is shown an electronic matrix array 30. The array 30 generally includes a first plurality of conductive address lines 32, a second plurality of address lines 34, and a plurality of selection devices in the form of diodes 36 between the address lines 32 and 34. The first and second plurality of address lines cross at an angle and are spaced apart by the diodes 36 to form a plurality of crossover points. As illustrated, the first and second address lines are orthogonally related and cross at an angle of 90°. As can also be seen in the Figure, the address lines are formed from parallel spaced apart bands of conductive material such as platinum or aluminum. Between each crossover point there is a diode 36. The diodes include a body of semiconductor material and preferably are formed from amorphous silicon alloys in accordance with the present invention. More particularly, and as will be further described with respect to FIGS. 2 through 5, the diodes preferably ar amorphous silicon alloys forming a p-i-n diode configuration.

The selection devices or diodes 36, as illustrated, are separated by orthogonally related grooves or channels 38. As will be described subsequently, the grooves or channels 38 are formed by etching the amorphous silicon alloys in the areas left exposed by address lines 32 and 34. This aids in providing electrical isolation between the diodes. However, because the lateral conductivity of the amorphous silicon alloys are relatively low, such channels or grooves may not be necessary for all applications. However, in view of the fact that the address lines 32 and 34 cross over with the diodes in between, either due to the limited lateral conductivity of the amorphous silicon alloys or the physical separation of the diodes by the channels or grooves 38, the diodes have an effective current conduction cross-sectional area formed by the overlapping juxtaposed common surface area of the address lines.

FIGS. 2A through 5A, and 2B through 5B illustrate the fabrication process of the diode matrix array of FIG. 1. As can be seen in FIGS. 2A and 2B, an amorphous silicon alloy p-i-n selection or diode structure 40 is first formed on a conductive substrate 42. This continuous selection means structure 40 preferably is a diode structure formed by a p-type amorphous silicon alloy region 40a, an intrinsic amorphous silicon alloy region 40b, and an n-type amorphous silicon alloy region 40 c.

Amorphous silicon alloys can be deposited in multiple layers over large area substrates to form such structures in high volume, continuous processing systems. Continuous processing systems of this kind are disclosed, for example, in pending patents: Ser. No. 151,301, filed May 19, 1980 for A Method Of Making P-Doped Silicon Films And Devices Made Therefrom, now U.S. Pat. No. 4,400,409 Ser. No. 244,386, filed Mar. 16, 1981 for Continuous Systems For Depositing Amorphous Semiconductor Material, now U.S. pat. No. 4,452,711 Ser. No. 240,493, filed Mar. 16, 1981 for Continuous Amorphous Solar Cell Production System, now U.S. Pat. No. 4,410,558; Ser. No. 306,146, filed Sept. 28, 1981 for Multiple Chamber Deposition And Isolation System and Method, now U.S. Pat. No. 4,438,723; and Ser. No. 359,825, filed Mar. 19, 1982 for Method And Apparatus For Continuously Producing Tandem Amorphous Photovoltaic Cells, now U.S Pat. No. 4,492,181. As disclosed in these applications, which are incorporated herein by reference, a substrate formed from stainless steel, for example, may be continuously advanced through a succession of deposition chambers, wherein each chamber is dedicated to the deposition of a specific material.

In making a p-i-n configuration, a single deposition chamber system can be used for batch processing or preferably, a multiple chamber system can be used wherein a first chamber is used for depositing a p-type amorphous silicon alloy, a second chamber is used for depositing an intrinsic amorphous silicon alloy, and a third chamber is used for depositing an n-type amorphous silicon alloy. Since each deposited alloy, and specially the intrinsic alloy must be of high purity, the deposition environment in the intrinsic deposition chamber is preferably isolated from undesirable doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent applications, deposition of the amorphous silicon alloy materials onto the large area continuous substrate is accomplished by glow discharge decomposition of the process gases. Among these processes, radio frequency energy glow discharge processes have been found suitable for the continuous production of amorphous semiconductors, the first use of which has been as photovoltaic devices. Also, a new and improved process for making amorphous semiconductor alloys and devices has recently been discovered. This process is disclosed in copending application Ser. No. 423,424, filed Sept. 24, 1982 for Method Of Making Amorphous Semiconductor Alloys and Devices Using Microwave Energy, now U.S. Pat. No. 4,517,223. This process utilizes microwave energy to decompose the reaction gases to cause the deposition of improved amorphous semiconductor materials. This process provides substantially increased deposition rates and reaction gas feed stock utilization. Microwave glow discharge processes can also be utilized in high volume mass production of devices as disclosed in copending application Ser. No. 441,280, filed Nov. 12, 1982, for An Improved Apparatus For The Manufacture Of Photovoltaic Devices, now U.S. Pat. No. 4,515,107, and to make layered structures as also disclosed in copending application Ser. No. 435,068, filed Oct. 18, 1982, for Method And Apparatus For Making Layered Amorphous Semiconductor Alloys Using Microwave Energy, now abandoned.

Figures 3A, 3B:
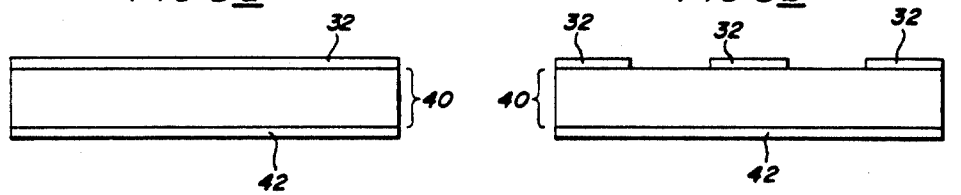

As shown in FIGS. 3A and 3B, after the p-i-n amorphous silicon alloy structure 40 is formed on the substrate 42, the top layer of conductive material from which will be formed the first plurality of address lines 32 is formed on the selection means or diode structure 40. The lines 32 can be formed in parallel bands, for example, by conventional photo-lithography techniques of the type well known in the art.

After the first plurality of address lines 32 are formed, the second plurality of address lines 34 are formed by removing selected portions of the substrate 42. This can be accomplished again, for example, by conventional photolithography techniques.

Figures 4A, 4B:
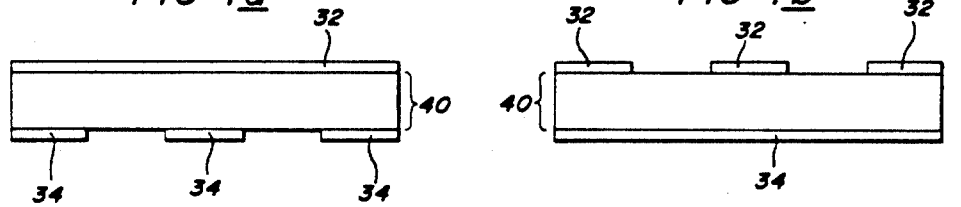

The resulting structure shown in FIGS. 4A and 4B represents a useful device in and of itself for many applications. This is due to the limited lateral conductivity of the amorphous silicon alloys comprising the diode structure.

Should further electrical isolation be desired, such isolation can be obtained as shown in FIGS. 5A and 5B or FIGS. 6A and 6B. In FIGS. A and 5B, the amorphous silicon diode structure 40 is etched to form the channels or grooves 38 in the areas thereof left exposed by the address lines 32 and 34. As a result, the address lines 32 and 34 can be used as a mask during the etching operation. The amorphous silicon alloy diode structure 40 need not be etched all the way through. In many cases, only the doped p and n-type regions need be etched through because these regions are of higher conductivity than the intrinsic region.

Although not illustrated, a potting compound can be introduced into the grooves or channels 38 after the etching process. This can be done to provide increased structural integrity for the finished device. Alternatively, the diode structure can be attached to another non-conductive substrae to provide increased structural integrity.

Figures 5A, 5B:
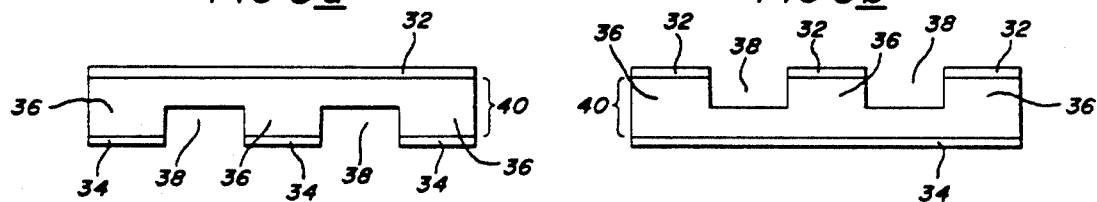
Figures 6A, 6B:
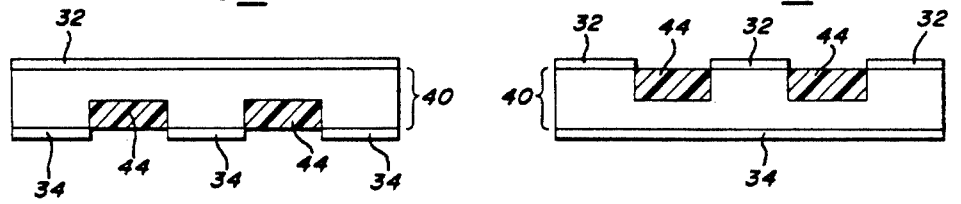
FIGS. 6A and 6B are partial side views similar to FIGS. 5A and 5B respectively which illustrate an alternative method of isolating the diodes of the matrix ray.

As an alternative to the etching operation illustrated in FIGS. 5A and 5B, the additional electrical isolation between the diodes 36 can also be provided by oxidizing the amorphous silicon alloy diode structure in the selected areas left exposed by the address lines 32 and 34. This can be accomplished by using the address lines as a mask and by either implanting oxygen into the selected areas of the amorphous silicon alloys or by exposing the entire structure to a high temperature oxidizing atmosphere. The resulting device will then include oxidized regions 44 in the selected areas. Whether the etching or oxidizing process is employed to provide the additional electrical isolation between the diodes, the electrical conductivity of the diode structure in the selected areas will be modified by being decreased to thereby increase the electrical isolation between the diodes 36.

Not only can the distributed electronic diode matrix array be formed over large area substrates, but the packing density thereof is greatly increased over prior art structures regardless of the lithography feature size used. This results because only one lithography step is necessary in fabricating the diode matrix, that being in forming the address lines. Thereafter, the address lines themselves can be used as masks for further processing. Also, the selection or diode structure 40 can be formed from polycrystalline material. This can be accomplished by annealing the selection means structure 40 prior to forming the first plurality of address lines at a temperature which converts the amorphous silicon alloys to polycrystalline silicon alloys. For example, if the selection structure initially comprises amorphous silicon-hydrogen alloys, it can be annealed at 550° C. for an hour to convert the same to polycrystalline material. If it is initially formed from an amorphous silicon-fluorine alloy, it can be annealed at 650° C. for an hour. This can also be done for any of the embodiments to be described hereinafter.

Further, if the first plurality of address lines are formed from a transparent conductor, such as indium tin oxide, the photoconductive properties of the p-i-n diode structures can be used to an advantage. Since the p-i-n diodes have photovoltaic characteristics, the diode matrix can be used as a data input terminal by, for example, shining light onto selected diodes. As a result, a detectable change in current will flow through selected respective pairs of the first and second address lines. This change in current, after detection, can be used for data input purposes.

Referring now to FIG. 7, it illustrates another electronic matrix array 50 which can be ROM, PROM or EEPROM array, or, depending on intended use, a field programmable logic array. The electronic matrix array 50 of FIG. 7 utilizes the diode matrix of FIG. 1 to facilitate individual selection or addressing of the memory cells of the devices. As a result, the elements which this array 50 have in common with the array 30 of FIG. 1 have been assigned corresponding reference numerals.

Referring now more particularly to FIG. 7, the array includes a first plurality of address lines 32, a second plurality of address lines 34, and a plurality of selection devices or diodes 36 at each crossover point of the first and second address lines 32 and 34. In addition, the array 50 includes a layer 52 of settable or resettable material between the diodes 36 and one of the plurality of address lines, here, the first plurality of address lines 32. Lastly, the channels or grooves 38 are provided to provide the previously mentioned additional electrical isolation.

As will be described more fully hereinafter, when the layer 52 is formed from a settable material having a normal substantially non-conductive state and a settable substantially non-resettable comparatively high conductive state, the array can be either a ROM, PROM, or a field programmable logic array. When the layer 52 is formed from a resettable material having a substantially non-conductive state and a comparatively high conductive state and which is settable and resettable between those states, the array comprises an EEPROM array.

FIGS. 8 through 12 illustrate a manner in which the array 50 of FIG. 7 can be fabricated. FIGS. 8A and 8B show that the diode structure 40 is first formed on the conductive substrate 42 as previously described. Then, the settable or resettable material 52 is deposited over the diode structure 40 as shown in FIGS. 9A and 9B. The first address lines 32 are then formed over the settable or resettable material 52 in a manner as previously described as shown in FIGS. 10A and 10B. Then, the second plurality of address lines are formed as previously described by etching portions of the substrate 42 as shown in FIGS. 11A and 11B. As before, the first and second plurality of address lines are formed so that they cross at an angle to form a plurality of crossover points. Lastly, as shown in FIGS. 12A and 12B, the areas of the amorphous silicon alloy and the resettable or resettable material are etched using the address lines as a mask to form the channels or grooves 38 and the diode bodies 36 with the memory material 52 in series therewith.

One preferred settable material from which the layer 52 can be formed is $Si_{50}C_{50}$. A memory cell made of this material is substantially irreversible, i.e., substantially nonresettable. This cell material has a maximum processing temperature of up to 500° C. and a maximum storage temperature of from 200° C. up to approximately 400° C. Devices made from this material can have a threshold voltage of eight volts. The SET resistance can be less than 500 ohms and an OFF resistance of up to $10^6$ ohms.

Silicon alloys produced by glow discharge or plasma deposition technique, have properties and characteristics similar to those of the $Si_{50}C_{50}$ material. One such material is a silicon oxygen material wherein the silicon is 95 to 100 atomic percent and the oxygen is from 5 to 0 atomic percent with one preferred material being $Si_{95}O_5$. Other materials or alloys can be formed from compound gases such as silane, silicon tetrafluoride, and hydrogen.

In forming the layer 52, the amorphous phase change materials are deposited onto the diode structure 40 to the desired thickness. The deposition techniques can be those described in the above referenced U.S. Pat. Nos. 4,217,374 and 4,226,898. One exemplary deposition process is a plasma deposition from $SiH_4$ which can include a diluent such as argon gas in about a one to one ratio. During the deposition, the substrate 42 is heated to about or less than 150° centigrade.

Between 500 and 2000 angstroms of settable material is deposited at an operating frequency of about 30 kilohertz, with about 800 angstroms producing a threshold voltage of eight volts. Varying the thickness of the layer 52 varies the threshold voltage required to set the phase change material into the conductive state. The silicon material described essentially cannot be reset.

The materials or alloys described above provide cell or memory region materials which have a stable, highly conductive state and a stable, highly non-conductive state. The non-conductive state is substantially non-resettably switchable into the stable, highly conductive state by applying a current limited voltage pulse or a voltage limited current pulse across the cell region exceeding a predetermined threshold level. The cell remains in the highly conductive state even in the absence of an applied voltage or current and under all operating conditions.

When the layer 52 is a resettable material, the memory material comprises a reversible, phase change material which can be set in a highly conductive state or a highly non-conductive state. More specifically, the layer 52 is formed of a material which is initially amorphous and which can be changed by a set voltage and current to a crystalline conductive state and then reset by a reset voltage and current to an amorphous insulator state or vice versa. One preferred material from which the resettable material can be made includes germanium and tellurium, such as $Ge_{20}Te_{80}$. This material has a good reversibility of up to $10^6$ cycles, a maximum storage temperature of 100° C., a threshold voltage of 8 volts, a SET resistance of 300 ohms and OFF resistance (at 175° C.) of approximately $10^4$ ohms. When such a material is used, a thin barrier layer of molybdenum can first be deposited by evaporation, for example, over the diode structure 40 to prevent migration.

As previously mentioned, when a settable material is used to form layer 52, a ROM or PROM device results. Selected individual memory cells can be set by applying the required threshold voltage and current to selective respective pairs of the first and second address lines. Once set, a memory cell cannot be reset. As a result, when a settable material is used, a PROM array results when the ultimate user does the programming, or a ROM array results if the array is programmed prior to receipt by the ultimate user.

When a resettable material is used for layer 52, an EEPROM array results. Such arrays, after once being programmed, can be reprogrammed.

The array 50 of FIG. 7 can also be used as a field programmable logic array. Preferably the array 50 is used to that end when a settable material is used for layer 52. With or without a layer 52 of resettable or settable material the diodes themselves can be fused to form a bilaterally conducting via or open circuit as required. The diodes can be fused to form a conducting via for example by applying a large current to a selected pair of address lines to locally heat that diode to a temperature in excess of the crystallization temperature. This is electrically programming the conducting via. A selected diode can be open circuited by passing an even larger current through the pair of address lines associated with that diode. This current should be sufficient to locally heat the amorphous silicon alloys forming the diode to a temperature which locally vaporizes the material to open circuit the same. As a result, field programmable logic arrays can also be obtained in accordance with the present invention.

Further, laser energy can also be used to program the memory cell material. U.S. Pat. No. 3,530,441 which issued to Stanford R. Ovshinsky on Sept. 22, 1970 discloses such a process and is incorporated herein by reference. Also, laser energy can be used to short circuit or open circuit selected diodes when memory cell material is not employed. The laser beam however must be of sufficient energy and exposed to the selected diodes for a sufficient period of time to locally heat the diode semiconductor material to fuse or open circuit the same. One set of address lines must therefore be transparent to laser light.

Referring now to FIG. 13, it illustrates another electronic matrix array 60 which can be a ROM, PROM, or EEPROM array or a field programmable logic array depending on the memory material used and the manner of programming the memory cells and diodes. The array 60 includes a first plurality of address lines 32, a second plurality of address lines 34, and a plurality of diodes 36 at the crossover points of the address lines 32 and 34. The array 60 also includes a plurality of discrete layers 62 of settable or resettable material within the areas defined by the crossover points. Again, the discrete layers 62 can also be formed from transducer materials for the reasons previously mentioned.

A method of fabricating the array 60 is shown in FIGS. 14 through 18. First, the diode structure 40, preferably of a p-i-n configuration, is formed on the substrate 42 in a manner as previously described. Then, as shown in FIGS. 15A and 15B, the memory material is deposited in discrete layers 62 in those areas which will later be within the areas defined by the crossover points. This can be done, for example, by conventional masking and photolithography techniques. Then, as shown in FIGS. 16A and 16B, the first plurality of address lines 32 is formed over the discrete layers of memory material 62 and diode structure 40. Thereafter, the second plurality of address lines 34 is formed by etching, in selected areas, the substrate 42. A useful electronic matrix array then results.

If additional electrical isolation is desired, the areas of the amorphous silicon alloys left exposed can either be etched as previously described or can be oxidized as previously described and as shown in FIGS. 18A and 18B. This leaves oxidized areas 64 to provide increased electrical isolation between the diodes 36.

By using the distributed diode array and the fabrication techniques previously described, a flat panel display can be fabricated with the additional technique of forming top conductors in a desired shape to form display electrodes. FIG. 19 illustrates a horizontal liquid crystal cell structure 70 of that type. It is to be understood that FIG. 19 shows only one such cell and that many such cells can be made with it to form a flat panel display.

The cell 70 includes top conductors 72 and 74, bottom conductors 76, 78, and 80, a plurality of diode bodies 82, 84, 86, 88, 90, and 92, and a pair of display electrodes 94 and 96, electrode 94 being directly over diode bodies 86 and 88 and electrode 96 being formed over conductor 72. As can be seen in the figure the top conductors 72 and 74 are substantially parallel. They cross the bottom conductors 76, 78, and 80 and are spaced therefrom to form a plurality of crossover points. Within these crossover points and between the conductors are the diode bodies 82, 84, 90, and 92. The electrode 94 also crosses conductors 78 and 80 to form a pair of crossover points wherein diode bodies 86 and 88 are located. The diodes 82, 90, and 92 are open circuited and the diode body 88 is fused to a high conductivity state. Diodes 84 and 86 have been left to function as diodes.

Although not shown so as to not unduly confuse the figure, a light influencing material, such as a liquid crystal material, is included between the electrodes 94 and 96. By the term "light influencing material" is meant any material which emits light or can be used to selectively vary the intensity, phase, or polarization of light either being reflected from or transmitted through the material. Liquid crystal material is only one such material having these characteristics. In order to set the liquid crystal, conductors 72 and 80 are energized. To reset the liquid crystal, conductors 72 and 74 are energized.

The structure of FIG. 19 can be fabricated by starting with the selection means or diode structure deposited onto a conductive substrate as shown, for example, in FIGS. 14A and 14B. Thereafter, the top conductors and electrodes are deposited onto the diode structure in the configuration as shown. Thereafter, the substrate is etched to form the bottom conductors 76, 78, and 80. Then, the areas of amorphous silicon left exposed by the conductors and electrodes are etched using the conductors and electrodes as a mask. Diodes 82, 90, and 92 are then open circuited by passing a current therethrough sufficient to vaporize the material forming the diodes and diode body 88 is fused. Lastly, the liquid crystal material is introduced between the electrodes 94 and 96. A schematic diagram of the display cell 70 is shown in FIG. 19A.

It may be desired to fill the open areas between the diode bodies and the conductors with a potting compound. This would provide added structural integrity for the cell 70.

As can be appreciated, since large area substrate and diode structures can be employed as starting materials, large area flat panel displays can be made in accordance with the present invention. Also, because relatively few lithographic steps need be performed to make the device, small cell size and hence, increased packing density and resolution can be obtained.

FIG. 20 illustrates another flat panel display liquid crystal cell 100. This cell is a vertical cell and includes a relatively large area top electrode 102. The cell 100 also includes top conductors 104 and 106 and bottom conductors 108, 110, and 112. Conductors 108 and 110 cross under conductor 104 forming a pair of crossover points having therein diode bodies 116 and 118. Conductors 108 and 110 also pass beneath electrode 102. The juxtaposed surface area of the conductors 108 and 112 with electrode 102 contain therebetween diode bodies 124 and 126. Similarly, conductors 112 and 108 cross under conductor 106 forming another pair of crossover points having diode bodies 128 and 130 therein. Lastly, diode bodies 120 and 122 are between electrode 102 and conductor 112. Diode bodies 116 and 130 have been open circuited, diode bodies 118 and 128 have been fused short circuited, and diode bodies 124, 126, 120, and 122 remain functional as diodes.

Not shown in the figure for purposes of not unduly complicating the same is the liquid crystal material deposited onto electrode 102 and a transparent conductor overlying the liquid crystal material. The transparent conductor would be coupled to a source of common potential. Diodes 124 and 126 form an AND gate. When the cell is energized a positive voltage is applied to conductors 104 and 108. To reset the cell, either one of conductors 104 and 108 is coupled to ground potential or a negative voltage.

The cell 100 can be fabricated by starting with the deposited diode structure over a conductive substrate as shown, for example, in FIGS. 14A and 14B. Then, the top conductors 104 and 106 and the electrode 102 are deposited on top of the diode structure in the desired configuration as shown. Then, the substrate is etched to form the bottom conductors 108, 110, and 112. Then, the areas of the amorphous silicon diode structure left exposed by the conductors and electrodes are etched to form the diode bodies. Thereafter, diodes 116 and 130 are open circuited by passing a current through the diodes sufficient to vaporize localized regions of the amorphous silicon forming the diodes to open circuit the same. Diode bodies 110 and 128 are short circuited by passing a current therethrough sufficient to heat the amorphous silicon alloys forming the diode bodies to a temperature which crystallizes the material. Lastly, the liquid crystal material is applied over the electrode 102 and the common electrode is applied over the liquid crystal material. The open spaces beneath the cell can be potted with a potting compound to increase the physical integrity of the cell if desired. Again, it should be understood that many such cells can be processed simultaneously on a single large area substrate and that just one such cell has been shown and described herein for purposes of illustration. A schematic diagram of the cell 100 is shown in FIG. 20A.

Figure 22:
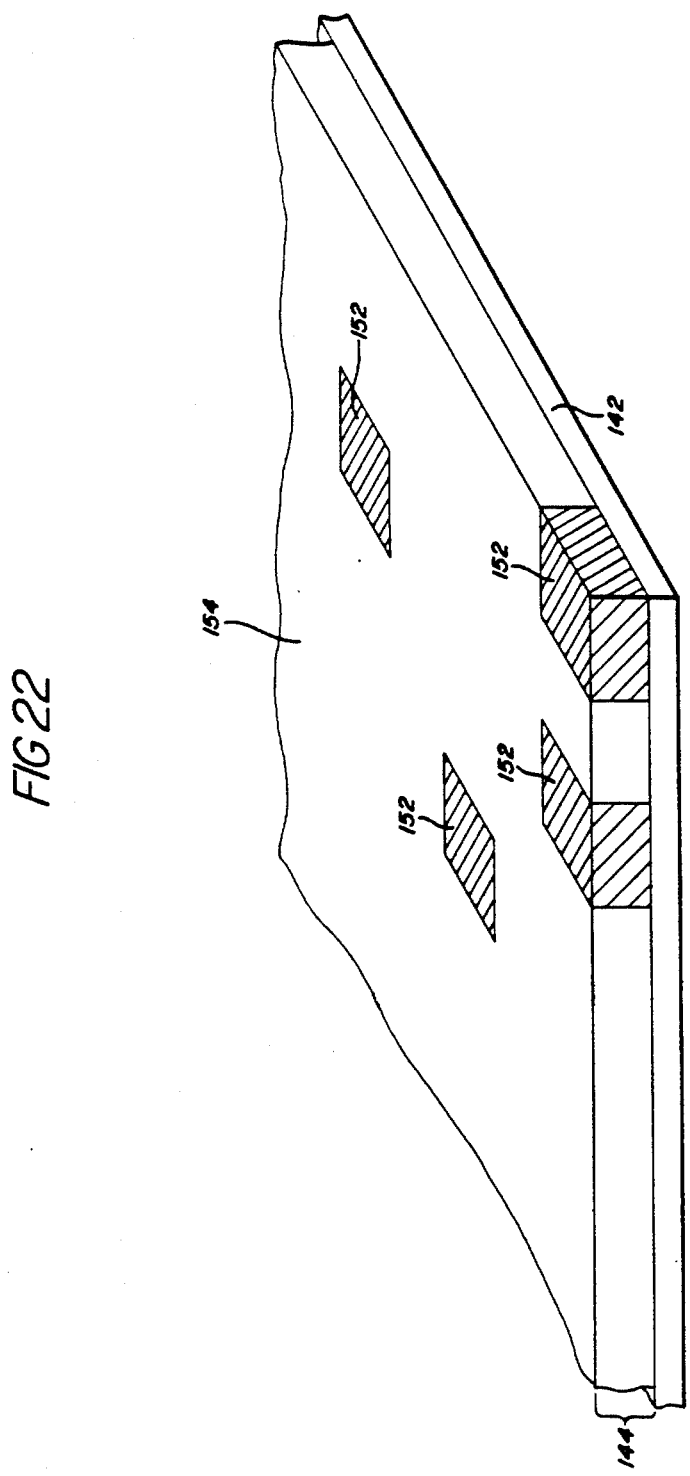
Figure 23:
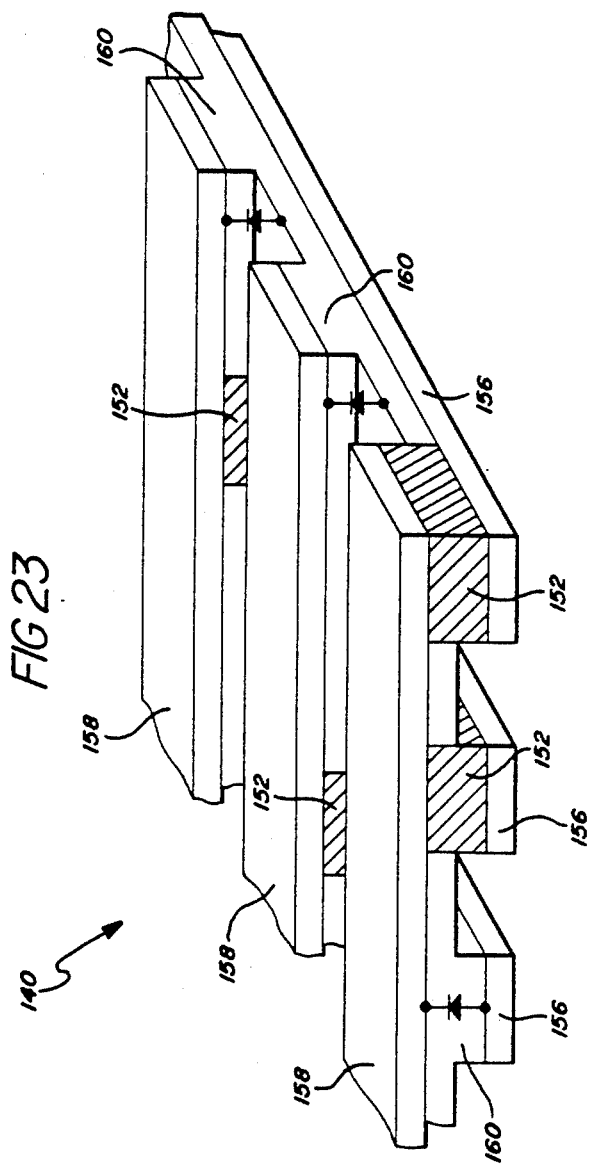
FIG. 23 is a partial perspective view of the preprogrammed array of circuits fabricated as shown in FIGS. 21 and 22.

Referring now to FIGS. 21 and 22, they illustrate a preprogrammed electronic array of circuits 140 as shown in FIG. 23 at intermediate stages of fabrication in accordance with the present invention. As shown in FIG. 21, the matrix array fabrication begins with a conductive substrate 142. Formed on the substrate 142 is at least one layer 144 of phase changeable material which can be either settable or resettable material and includes the diode structure, as previously described. In accordance with this embodiment, the layer 144 is a diode structure formed from amorphous silicon alloys. The diode structure can have p-i-n configuration and be formed by depositing a p-type layer onto substrate 142, an intrinsic layer over the p-type layer, and then an n-type layer over the instrinsic layer. Such a procedure has been previously described and can be used to form the diode structure.

After the diode structure of layer 144 is formed, a mask 146 is applied to the diode structure 144. The mask includes one or more openings 148 configured to define and expose selected portions of the diode structure 144 to be irradiated for changing the selected portions from the substantially nonconductive state of the amorphous silicon to the comparatively high conductive state of crystalline material. The openings 148 are also preferably configured to define areas substantially the same as the cross sectional area of the crossover points formed by the overlapping juxtaposed common surface area of the address lines to be subsequently formed.

In practice, the mask 146 can be a physically separate sheet of material brought into contact with the diode structure 144 or can be a photoresist formed over the diode structure with the openings 148 being formed by conventional photolithography techniques.

After the mask 146 is thus applied to the diode structure 144, the selected portions of the diode structure defined by the openings are irradiated through the mask 146. To that end, a high-intensity photoflash lamp 149 is provided. A xenon photoflash lamp is a particularly useful and effective photoflash lamp for this application. It directs a wide angle light beam 150 to impinge upon the entire area of the mask 146. When the selected areas of the diode structure are flashed or irradiated by the lamp 149 through the mask, the selected areas will be locally heated for changing the state of the material in the substrate areas from the substantially nonconductive state to the comparatively high conductive state. The mask is then removed by physically removing the same if it is a physically integral sheet of material, or by chemical treatment if it is formed of a photoresist material. The partially completed matrix array will then appear as illustrated in FIG. 22.

In FIG. 22, it can be seen that the selected areas 152 which were exposed to the light radiation have been changed to the comparatively high conductive state. The remaining portions 154 of the diode structure 144 are left in the substantially nonconductive state because these areas were not exposed to the light radiation. Hence, when the address lines are formed on opposite sides of the diode structure 144, the area portions of the unexposed area 154 which will be between the address lines will function fully as diodes.

Referring now to FIG. 23, it illustrates a completed electronic matrix array 140 which has been fabricated in accordance with this embodiment of the present invention. While the array 140 is not a memory array, it can be extremely useful to establish selected circuits for use in logic arrays and flat panel displays, for example. A first set of address lines 156 have been formed by removing portions of the conductive substrate 142. A second set of address lines 158 have also been formed over the diode structure. The address lines 158 can be formed by conventional evaporation processes as previously disclosed and configured by conventional photolithography procedures. The address lines 158 can also be aligned with the phase changed areas 152 by detecting the location of the areas 152. This can be done, for example, by optical techniques known in the art because the phase changed selected areas 152 will have optical properties different from the other areas 154 which were not changed in phase. Thereafter, the address lines 158 can be aligned in accordance with the detected locations of the selected areas 152.

As can also be seen in FIG. 23, like the electronic matrix arrays previously described, the first and second sets of address lines 156 and 158 cross at an angle to form crossover points. The juxtaposed common surface area of the address lines therefore define diode bodies 160 in those areas which were not phase changed. The selected areas 152 which were phase changed will function as shorted diodes. Hence, the electronic matrix array 140 will function like the electronic matrix array 30 of FIG. 1, but will be preprogrammed.

As a result, the need to serially electronically program the array is rendered unnecessary. Also, because the array 140 has been programmed in a parallel manner with all of the selected areas being phase changed simultaneously by the flash lamp, considerable time and expense is saved. This is significant given the extremely high capacity and density of these arrays. The address lines 156 and 158 can be applied using the same lamp 149 and lens system (not illustrated) as utilized to program the array. Therefore, any optical misalignment or optical curvature will be aligned in each layer and the crossover points will retain their alignment even though the lines may not be perfectly straight and perpendicular to one another.

The array 140 can be manufactured to be field programmable in a substantially similar fashion to that described above, the difference being that the layer 144 is not preprogrammed during manufacture. The structure is completed as shown in FIG. 23 and then can be field programmed by utilizing a mask similar to the mask 146. In this embodiment, at least one set of the address lines 156 or 158 is transparent to the programming light so that the selected diodes 152 can be switched through the lines.

As can also be seen in FIG. 23, the areas of the diode structure left exposed by the address lines 156 and 158 have been partially removed by utilizing the address lines as a mask. This alters the conductivity or resistivity between the diode bodies 160 and the selected diode structure portions 152 or between the diode bodies 160 before field programming for increasing the isolation therebetween. As previously mentioned, this may not be necessary for many applications.

Figure 24:
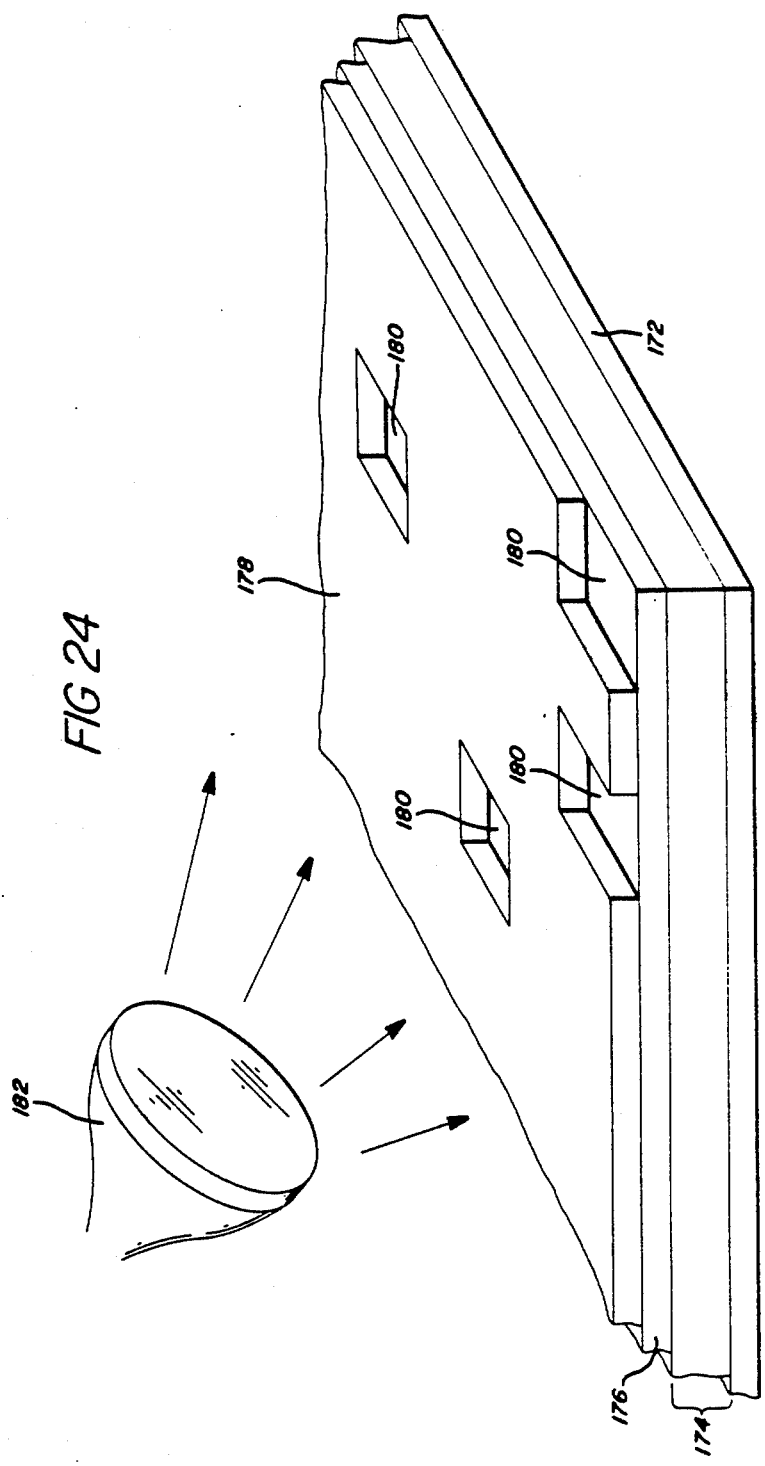
FIGS. 24 and 25 are partial perspective views illustrating the method of making a preprogrammed electronic matrix memory array in accordance with another embodiment of the present invention.
Figure 25:
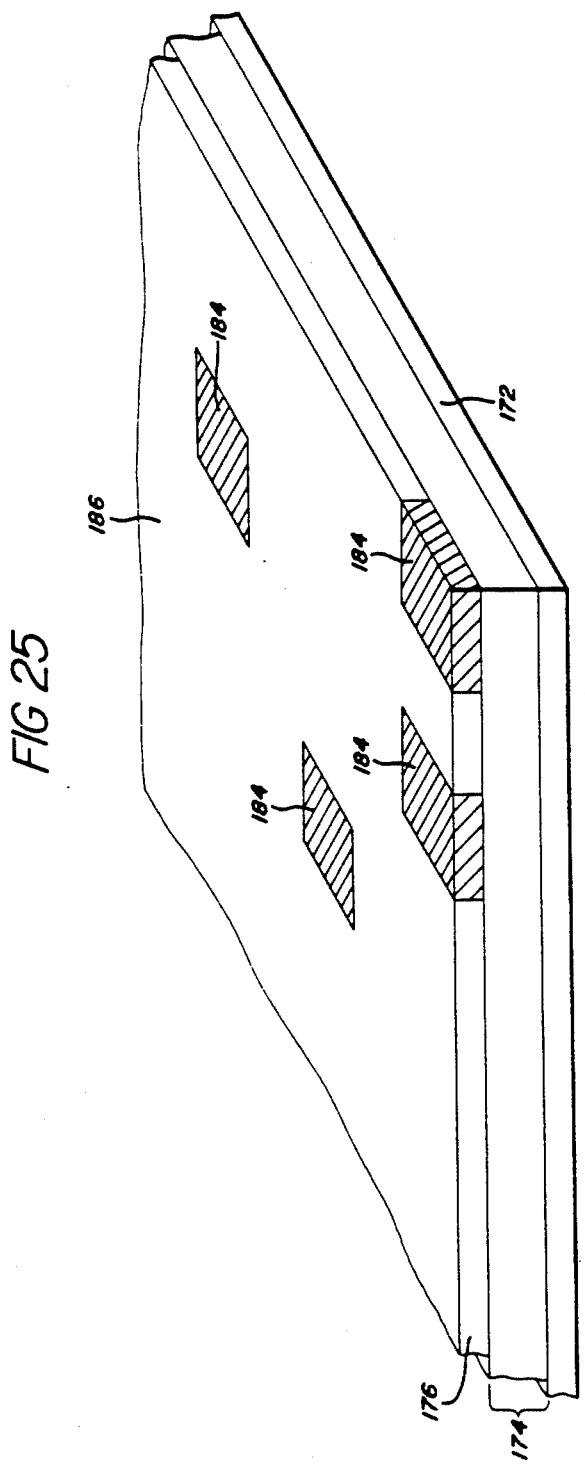
Figure 26:
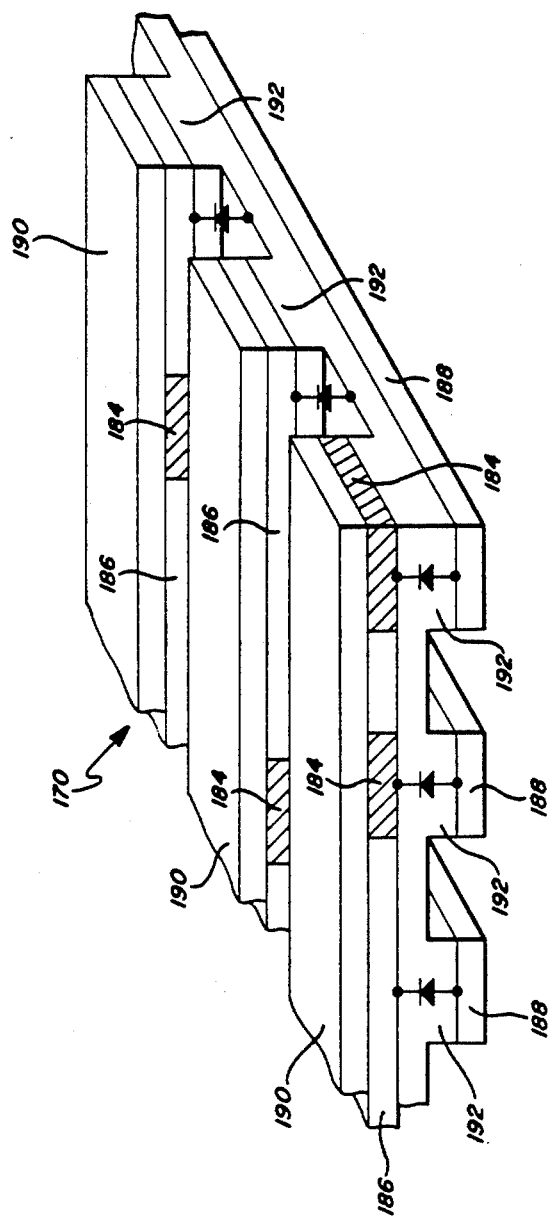
FIG. 26 is a partial perspective view of the preprogrammed electronic matrix memory array fabricated as shown in FIGS. 24 and 25.

Referring now to FIGS. 24 and 25, they illustrate a preprogrammed electronic matrix array 170 as shown in FIG. 26 at intermediate stages of fabrication in accordance with another embodiment of the present invention. The array 170 can be used as a PROM, a ROM, or an EEPROM, depending on the materials used for forming the phase changeable layer as will be described hereinafter.

As shown in FIG. 24, the matrix array fabrication begins with a conductive substrate 172. Formed on the substrate 172 is a continuous selection means or diode structure 174 of the type previously referred to. Deposited or formed over the diode structure 174 is a layer of phase changeable material 176. The phase changeable material forming layer 176 is preferably settable or resettable material as previously described.

If the array is to be used as a PROM or ROM, then the layer 176 is formed from settable material which has a substantially nonconductive state and a settable, substantially nonresettable, comparatively high conductive state. Such a material can be, for example, an amorphous silicon alloy as previously described, or a doped amorphous silicon alloy as disclosed in copending application Ser. No. 281,018, filed July 6, 1981, for An Improved Programmable Cell For Use In Programmable Electronic Arrays, now U.S. Pat. No. 4,499,557 which is assigned to the assignee of the present invention.

If the array is to be used as an EEPROM, the layer is formed from a resettable material which has a substantially nonconductive state and a comparatively high conductive state and which can be set and reset between these two states. Such a material can be, for example, a chalcogenide as previously described.

After the layer 176 of settable or resettable material is formed over the diode structure 174, a mask 178 is placed or formed over the layer 176. The mask can take the form of mask 146 of FIG. 21. The mask 178 also has openings 180 configured to define and expose selected portions of the layer 176 to be irradiated for changing the selected portions from the substantially nonconductive state to the comparatively high conductive state. The openings 180 are also preferably configured to define areas of substantially the same cross sectional area at the crossover points formed by the overlapping juxtaposed common surface area of the address lines to be subsequently formed.

After the mask 178 is thus formed or placed over the layer 176, the selected portions of the layer 176 defined by the openings are irradiated through the mask 178. Again, for this purpose, a high-intensity photoflash lamp 182 is provided. It can be of the type as previously referred to with respect to lamp 149 of FIG. 21. Once the selected areas of the layer 176 are flashed or irradiated by the lamp 182, the selected areas will have been locally changed from the substantially nonconductive state to the comparatively high conductive state. Here, the energy supplied to the lamp must be controlled so that only the layer 176 in the selected areas change state, and not the diode structure 174 beneath the layer 176.

After the selected areas of the layer 176 are irradiated, the mask 178 is removed by physically removing the same if it is a physically integral sheet of material, or by chemical or other removal treatment if it is formed of a photoresist material. The partially completed matrix array will then appear as illustrated in FIG. 25.

In FIG. 25, it can be seen that the selected areas 184 which were exposed to the light radiation have been changed to the comparatively high conductive state. The remaining portions 186 of the layer 176 are left in the substantially nonconductive state because these areas were not exposed to the light radiation.

Referring now to FIG. 26, it illustrates a completed electronic matrix array 170 which has been fabricated in accordance with this embodiment of the present invention. A first set of address lines 188 have been formed by removing portions of the conductive substrate 172. A second set of address lines 190 have also been formed over the diode structure. The address lines 190 can be formed by conventional evaporation processes as previously disclosed and configured by conventional photolithograph procedures. The address lines 190 can also be aligned with the phase changed areas 184 by detecting the location of the areas 184. This can be done, for example, by optical techniques known in the art because the phase changed selected areas 184 will have optical properties different from the other areas 186 which were not changed in phase. Thereafter, the address lines 190 can be aligned in accordance with the detected locations of the selected areas 184.

As can also be seen in FIG. 26, like the electronic matrix arrays previously described, the first and second sets of address lines 188 and 190 cross at an angle to form crossover points. The juxtaposed common surface area of the address lines therefore define diode bodies 192 in series with the programmed layer portions 184 and 186. The electronic matrix array 170 will function like the electronic matrix array 50 of FIG. 7, but will be preprogrammed.

As a result, the need to serially electronically program the array 170 is rendered unnecessary. Also, because the array 140 has been programmed in a parallel manner with all of the selected areas being phase changed simultaneously by the flash lamp, considerable time and expense is saved. This is significant given the extremely high capacity and density of these arrays.

The selected switched crossover points 184 also can be tested after programming to ensure that the correct information is encoded in the array 170. In the case of the preprogrammed embodiment illustrated in FIG. 25, the areas 184 and remaining areas can be read or sensed by optical means, such as a laser as previously described. In the case of the field programmed array, the information or pattern encoded can be read optically or electrically. The areas which are not properly programmed can be individually programmed by optical means, in the case of the preprogrammed array, or optical or electrical means, in the case of the field programmable array.

Especially in the case of the field programmable array, the array may be cooled before and/or during programming. This avoids unwanted heat transfer to other parts of a device in which the array 170 is incorporated. Cooling also can facilitate individual area switching after testing to avoid heating adjacent areas.

As described with respect to the array 140 and FIG. 23, the array 170 can also be formed in a field programmable embodiment by not preprogramming the areas 184. Again, one set of lines 188 or 190 must be transparent to the programming light, the array 170 can be cooled during programming and the programmed array 170 can be tested and reprogrammed if necessary. If the layer 176 is formed of resettable material, then the array 170 can also be bulk erased and reprogrammed.

As can also be seen in FIG. 26, the areas of the diode structure and the layer of settable or resettable material left exposed by the address lines 188 and 190 have been partially removed by utilizing the address lines as a mask. This alters the conductivity or resistivity between the diode bodies 192 for increasing the isolation therebetween. As previously mentioned, this may not be necessary for many applications.

As previously mentioned with respect to the structure illustrated in FIG. 25, the selected areas 184 were converted to the comparatively high conductive state. In doing so, those areas 184 were changed from the amorphous phase to crystalline phase. In accordance with a further embodiment of the present invention, the difference in structure between the areas 184 and the areas 186 can be used to advantage in making a preprogrammed electronic array wherein the selected portions of the array rendered highly conductive cannot be reset to a substantially nonconductive state.

Figure 27:
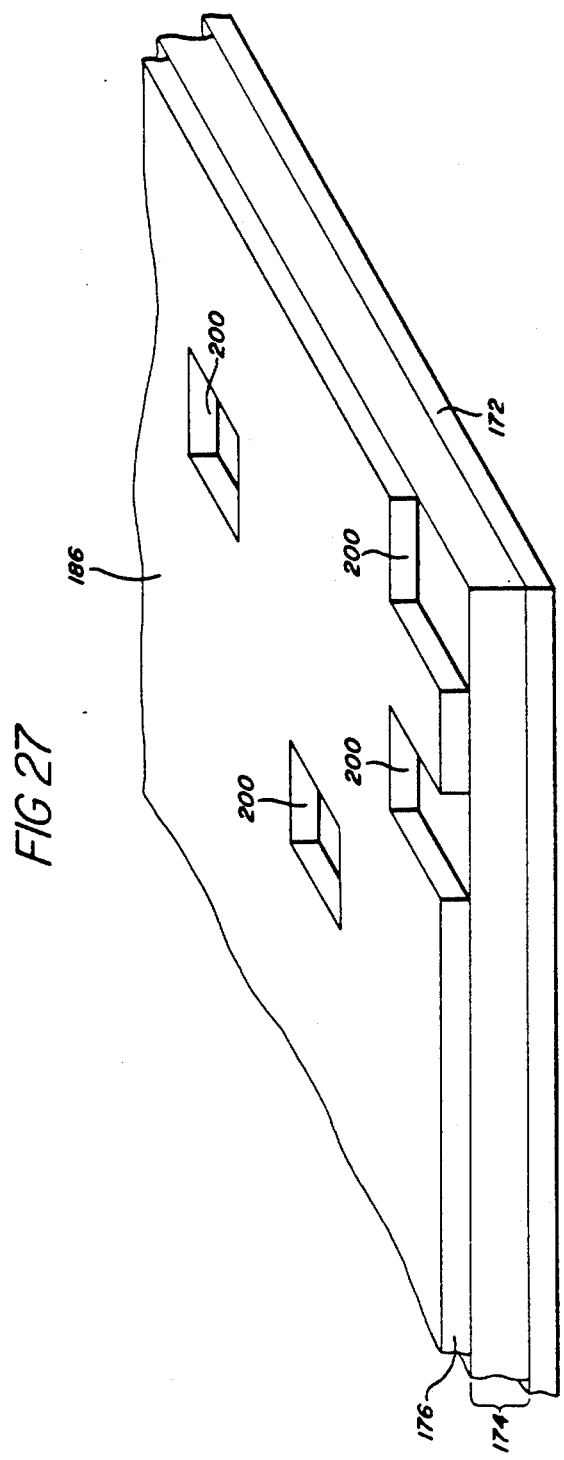
FIG. 27 is a partial perspective view of another electronic matrix memory array during fabrication in accordance with still another embodiment of the present invention.

In making such an array, the layer 176 can be subjected to a wet etchant such as nitric acid, which will selectively etch the crystalline phase portions 184 at a faster rate than the amorphous portions 186. After this etching process, the structure of FIG. 25 will take the form as shown in FIG. 27. Here it can be seen that the crystalline phase portions 184 have been removed forming voids 200 with the diode structure 174 exposed therebeneath and that the amorphous or substantially nonconductive portion 186 remains on top of the diode structure 174.

Figure 28:
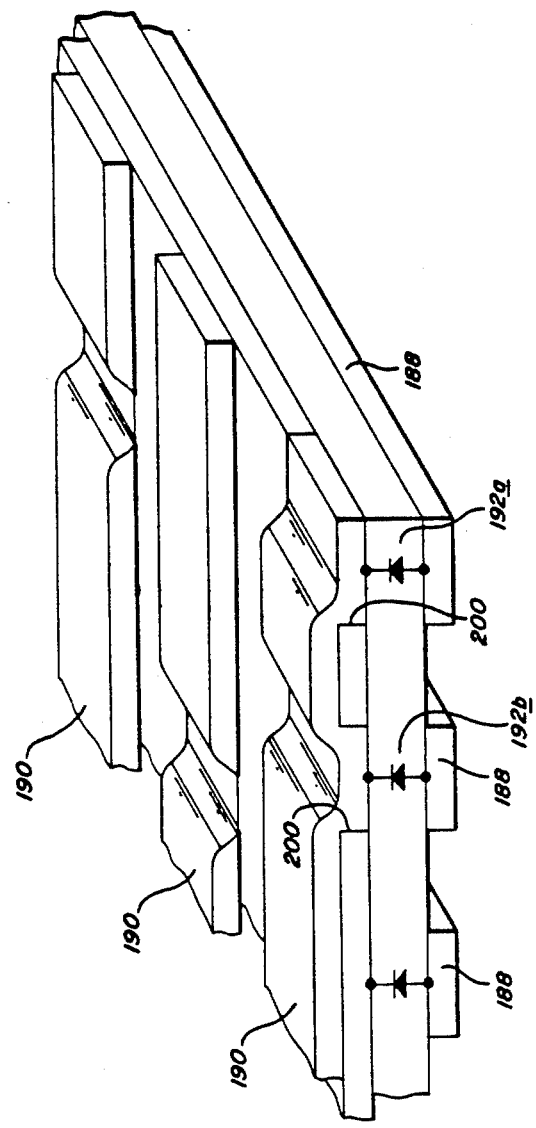
FIG. 28 is a partial perspective view of the electronic matrix memory array partly fabricated in FIG. 25.

Now, as can be seen in FIG. 28, after the second set of address lines 190 is formed, they will directly contact the diode structure in those areas which were exposed to the light radiation and removed by the etchant. For example, as can be seen in FIG. 28, diode bodies 192a and 192b are in direct contact with the address line 190 which overlies them. As a result, there is a permanent, highly conductive path established between the diode bodies 192a and 192b and the address line 190 which cannot be altered. In all other respects, the array of FIG. 28 is substantially identical to the array 170 of FIG. 26.

Many modifications and variations of the present invention are possible in light of the above teachings. For example, the amorphous silicon diode bodies can have numerous sizes and shapes and can also have an n-i-p configuration. Also, multiple p-i-n structures can be deposited in tandem to form multiple diode structures. When several layers of conductors are deposited, each separated by a layer of thin film semiconductor material, a multi-level structure is formed with many levels of electrically interconnectable programmable diode cells. Multiple diode structures would be desired for some operating voltage and current requirements and multi-level structures are desired for maximum gate or bit density and minimum interconnecting circuit lengths. Also, even though the layers of phase changeable material have been described as being deposited in the amorphous state, the resettable materials can also be initially formed in the crystalline state prior to being irradiated. By the term "amorphous" is meant an alloy or material which has long range disorder, although it can have short or intermediate order or even contain at times crystalline inclusions. A suitable etchant can be selected to remove the amorphous areas instead of the crystalline areas if so desired. Also, in the field programmable embodiment, the array can include alignment areas which are preprogrammed to facilitate the field programming alignment. It is therefore, to be understood that within the scope of the appended claims the invention can be practiced otherwise than as specifically described.

What is claimed is:

1. A method of making an electronic matrix array comprising the steps of:
    forming at least one layer of phase changeable material on a substrate, said phase changeable material having a substantially nonconductive state and a comparatively high conductive state, said layer being formed in one of said states;
    parallel programming said layer by irradiating selected areas of said layer to simultaneously convert said selected areas of said layer to the other one of said states to form selected substantially nonconductive portions of said layer and selected comparatively high conductive portions of said layer;
    forming first and second sets of electrically conductive address lines on respective opposite sides of said layer, said address lines of said first and second sets being formed for crossing at an angle to form a plurality of crossover points; and
    said selected substantially nonconductive layer portions and said selected comparatively high conductive layer portions being formed between said first and second sets of address lines.

2. The method as defined in claim 1, wherein each of said comparatively high conductive layer portions are formed to define a discrete area of said layer which is not substantially larger than the area of said crossover points defined by the overlapping juxtaposed common surface areas of said address lines.

3. The method as defined in claim 1, wherein said step of irradiating selected areas of said layer includes irradiating said layer through a mask.

4. The method as defined in claim 3, wherein said step of irradiating includes cooling said layer at least during said irradiating.

5. The method as defined in claim 3, wherein said step of irradiating said layer includes laying said mask over said layer in contact therewith.

6. The method as defined in claim 1, wherein said step of forming said address lines includes forming one of said sets of address lines by removing portions of said conductive substrate.

7. The method as defined in claim 1, wherein said step of forming said address lines includes forming said lines after irradiating said areas and detecting the locations of the layer portions of one of said states and thereafter aligning one of said sets of address lines on said layer according to the detected locations of said layer portions of said one of said states.

8. The method as defined in claim 1, wherein said step of forming said layer of phase changeable material includes depositing a layer of amorphous material.

9. The method as defined in claim 8, wherein said layer is formed from an amorphous silicon alloy material.

10. The method as defined in claim 8, wherein said layer is formed from a chalcogenide material.

11. The method as defined in claim 8, wherein said step of irradiating selected areas of said layer includes irradiating said selected areas with light for changing said amorphous material to said comparatively high conductive state within said selected areas.

12. The method as defined in claim 1, wherein said step of forming said phase changeable material includes depositing a plurality of layers of semiconductor material on said substrate to form a continuous diode structure on said substrate.

13. The method as defined in claim 1, including the further step of forming a continuous diode structure over said substrate and wherein said layer of phase changeable material is formed over said diode structure.

14. The method as defined in claim 13, wherein said step of forming said diode structure includes depositing a first doped semiconductor layer over said substrate, depositing an intrinsic semiconductor layer over said first layer, and depositing a second doped semiconductor layer over said intrinsic layer.

15. The method as defined in claim 14, wherein said semiconductor layers are formed of amorphous semiconductor material.

16. The method as defined in claim 13, wherein said layer of phase changeable material is a chalcogenide material.

17. The method as defined in claim 13, wherein said layer of phase changeable material is an amorphous silicon alloy.

18. The method as defined in claim 1, further including the step of removing said comparatively high conductive layer portions prior to forming said address lines.

19. The method as defined in claim 1, wherein said step of forming said address lines includes forming said lines prior to irradiating said areas and forming at least one of said sets of address lines of substantially irradiation transparent material.

20. The method as defined in claim 19, wherein said step of irradiating selected areas of said layer includes irradiating said layer through a mask and through said transparent lines.

21. The method as defined in claim 20, wherein said step of irradiating said layer includes laying said mask over said transparent lines in contact therewith.

22. The method as defined in claim 1, including testing said selected portions to insure that the portions are in their programmed states.

23. The method as defined in claim 22, wherein said phase changeable material is resettable, further including bulk erasing said layer so that it can then be reprogrammed.

24. The method as defined in claim 22, including optically testing said selected portions.

25. The method as defined in claim 22, including electrically testing said selected portions.

26. The method as defined in claim 22, including reprogramming selected non-converted areas which did not change states.

27. The method as defined in claim 26, including optically reprogramming said areas.

28. The method as defined in claim 26, including electrically reprogramming said areas.

* * * * *